United States Patent
Yin et al.

(10) Patent No.: US 9,995,875 B2
(45) Date of Patent: Jun. 12, 2018

(54) METHOD AND APPARATUS FOR PRODUCING CRYSTALLINE CLADDING AND CRYSTALLINE CORE OPTICAL FIBERS

(71) Applicants: The Penn State Research Foundation, University Park, PA (US); General Opto Solutions, LLC, State College, PA (US)

(72) Inventors: Shizhuo Yin, State College, PA (US); Fang Luo, State College, PA (US)

(73) Assignees: The Penn State Research Foundation, University Park, PA (US); General Opto Solutions, LLC, State College, PA (US)

( * ) Notice: Subject to any disclaimer, the term of this patent is extended or adjusted under 35 U.S.C. 154(b) by 36 days.

(21) Appl. No.: 15/220,807

(22) Filed: Jul. 27, 2016

(65) Prior Publication Data

US 2017/0031091 A1    Feb. 2, 2017

Related U.S. Application Data

(60) Provisional application No. 62/282,636, filed on Aug. 6, 2015, provisional application No. 62/282,235, filed on Jul. 28, 2015.

(51) Int. Cl.
    *G02B 6/036* (2006.01)
    *G02B 6/02* (2006.01)
    (Continued)

(52) U.S. Cl.
    CPC ........ *G02B 6/02395* (2013.01); *C03C 13/048* (2013.01); *C30B 1/04* (2013.01);
    (Continued)

(58) Field of Classification Search
    CPC ............ G02B 6/02395; G02B 6/03622; C03C 13/048; C03B 1/04; C03B 9/00; C03B 19/04; C03B 19/12; C03B 29/22
    (Continued)

(56) References Cited

U.S. PATENT DOCUMENTS 3,341,302 A    9/1967  Flanigen et al.
3,759,759 A    9/1973  Solomon
(Continued)

FOREIGN PATENT DOCUMENTS

JP    5786802 A    5/1982
JP    6335490 A    2/1988
(Continued)

OTHER PUBLICATIONS

Koroleva, T.S. Metody vyraschivaniya kristallicheskikh volokon na osnove torida natriya. Vestnik KRSU, 2005, Tom 5 No. 7, p. 100-104.
(Continued)

*Primary Examiner* — Jerry Blevins
(74) *Attorney, Agent, or Firm* — Buchanan Ingersoll & Rooney PC

(57) ABSTRACT

We provide methods and apparatus for preparing crystalline-clad and crystalline core optical fibers with minimal or no breakage by minimizing the influence of thermal stress during a liquid phase epitaxy (LPE) process as well as the fiber with precisely controlled number of modes propagated in the crystalline cladding and crystalline core fiber via precisely controlling the diameter of crystalline fiber core with under-saturated LPE flux. The resulting crystalline cladding and crystalline core optical fibers are also reported.

15 Claims, 28 Drawing Sheets

(51) Int. Cl.
| | | |
|---|---|---|
| *C03C 13/04* | (2006.01) | |
| *C30B 1/04* | (2006.01) | |
| *C30B 9/00* | (2006.01) | |
| *C30B 19/04* | (2006.01) | |
| *C30B 19/12* | (2006.01) | |
| *C30B 29/22* | (2006.01) | |
| *H01S 3/067* | (2006.01) | |
| *H01S 3/094* | (2006.01) | |
| *H01S 3/16* | (2006.01) | |

(52) U.S. Cl.
CPC ............... *C30B 9/00* (2013.01); *C30B 19/04* (2013.01); *C30B 19/12* (2013.01); *C30B 29/22* (2013.01); *G02B 6/03622* (2013.01); *G02B 6/03633* (2013.01); *H01S 3/067* (2013.01); *H01S 3/094007* (2013.01); *H01S 3/162* (2013.01); *H01S 3/1611* (2013.01); *H01S 3/1623* (2013.01); *H01S 3/1643* (2013.01)

(58) Field of Classification Search
USPC ........................................................ 385/128
See application file for complete search history.

(56) References Cited

U.S. PATENT DOCUMENTS

| | | |
|---|---|---|
| 3,809,010 A | 5/1974 | Springthorpe |
| 3,902,454 A | 9/1975 | Kobayasi |
| 3,944,640 A | 3/1976 | Haggerty et al. |
| 3,967,987 A | 7/1976 | Jones et al. |
| 4,012,242 A | 3/1977 | Matare |
| 4,273,609 A | 6/1981 | Nelson et al. |
| 4,354,453 A | 10/1982 | Koike et al. |
| 4,373,989 A | 2/1983 | Mattauch et al. |
| 4,393,806 A | 7/1983 | Mahieu et al. |
| 4,428,646 A | 1/1984 | Lighty |
| 4,532,000 A | 7/1985 | Harrington et al. |
| 4,552,434 A | 11/1985 | Murakami et al. |
| 4,642,143 A | 2/1987 | Connolly et al. |
| 4,662,983 A | 5/1987 | Chin |
| 4,761,202 A | 8/1988 | Bordui et al. |
| 4,779,561 A | 10/1988 | Fromage et al. |
| 4,818,722 A | 4/1989 | Heinen |
| 4,826,288 A | 5/1989 | Mansfield et al. |
| 5,077,087 A | 12/1991 | Byer et al. |
| 5,078,768 A | 1/1992 | Aggarwal et al. |
| 5,113,472 A | 5/1992 | Gualtieri et al. |
| 5,244,485 A | 9/1993 | Hihara et al. |
| 5,245,689 A | 9/1993 | Gualtieri |
| 5,334,278 A | 8/1994 | Lee |
| 5,352,259 A | 10/1994 | Oku et al. |
| 5,451,553 A | 9/1995 | Scott et al. |
| 5,549,746 A | 8/1996 | Scott et al. |
| 5,572,725 A | 11/1996 | Morris et al. |
| 5,579,427 A | 11/1996 | Rusanov et al. |
| 5,664,040 A | 9/1997 | Kramer et al. |
| 5,735,927 A | 4/1998 | Sanghera et al. |
| 5,737,117 A | 4/1998 | Imaeda et al. |
| 6,122,934 A | 9/2000 | Narita et al. |
| 6,139,630 A | 10/2000 | Fujiyama et al. |
| 6,446,468 B1 | 9/2002 | Fleming, Jr. et al. |
| 6,598,429 B1 | 7/2003 | Jiang et al. |
| 6,743,294 B2 | 6/2004 | Pandelisev |
| 6,837,075 B1 | 1/2005 | Snowdon et al. |
| 7,215,858 B2 | 5/2007 | Po |
| 7,218,004 B2 | 5/2007 | Pan et al. |
| 7,435,295 B2 | 10/2008 | Kitaoka et al. |
| 7,486,862 B2 | 2/2009 | Ohga et al. |
| 7,615,115 B2 | 11/2009 | Mizutani et al. |
| 7,905,114 B1 | 3/2011 | Horne et al. |
| 8,132,429 B2 | 3/2012 | Pedrido |
| 8,519,379 B2 | 8/2013 | Yu et al. |
| 8,846,969 B2 | 9/2014 | Gunter et al. |
| 2003/0164006 A1 | 9/2003 | Buchanan et al. |
| 2005/0201715 A1* | 9/2005 | Ellwood, Jr. ........ G02B 6/2746 385/147 |
| 2006/0236723 A1 | 10/2006 | Buellesfeld et al. |
| 2008/0008438 A1 | 1/2008 | Fukuda et al. |
| 2009/0155580 A1 | 6/2009 | Shibata et al. |
| 2009/0180745 A1 | 7/2009 | Zerfas et al. |
| 2014/0079363 A1 | 3/2014 | Hsu et al. |

FOREIGN PATENT DOCUMENTS

| | | |
|---|---|---|
| JP | 05221674 A | 8/1993 |
| RU | 2235072 C2 | 8/2004 |

OTHER PUBLICATIONS

Zhiro A. Tekhnologii proizvodstva opticheskikh volokon. Obzor Poslednikh razrabotok. Nauka i tekhnika, No. 4 (317), 2009, p. 22-27.

International Search Report for PCT/US2016/044215 dated Dec. 8, 2016.

Written Opinion of the International Searching Authority for PCT/US2016/044215 dated Dec. 8, 2016.

J. Harrington, "Single-Crystal Fiber Optics: A Review", Proc. of SPIE vol. 8959, (2014); 9 pages.

J.M. Robertson, "Liquid Phase Epitaxy of Garnets", Journal of Crystal Growth, (1978); pp. 233-242.

N. Itoh et al., "Small Optical Magnetic-Field Sensor that Uses Rare-Earth Iron Garnet Films Based on the Faraday Effect", Applied Optics, vol. 38, (1999); pp. 2047-2051.

J. Dawson et al., "Power-Scaling Analysis of Fiber Lasers and Amplifiers Based on Non-Silica Materials", Proc. of SPIE vol. 7686, (2010); 12 pages.

* cited by examiner

METHOD AND APPARATUS FOR PRODUCING CRYSTALLINE CLADDING AND CRYSTALLINE CORE OPTICAL FIBERS

CROSS-REFERENCE TO RELATED APPLICATIONS

This application claims priority to U.S. Provisional Application No. 62/282,636, filed on Aug. 6, 2015, and to U.S. Provisional Application No. 62/282,235, filed on Jul. 28, 2015. Both of those applications are incorporated by reference herein.

FIELD OF INVENTION

Embodiments related to methods and apparatus for fabricating crystalline cladding and crystalline core optical fibers. Applications of the clad crystalline fibers to fiber lasers, fiber amplifiers, fiber sensors, and other fiber optic components and devices are also reported.

BACKGROUND OF THE RELATED ART

The importance of crystalline optical fibers goes back at least to the introduction of laser melting technology in 1976. See, e.g., U.S. Pat. No. 3,944,640. Crystalline fibers may be, for example Neodymium (Nd)/Ytterbium (Yb)/Erbium (Er) doped yttrium aluminum garnet (YAG) fibers. In comparison to glass optical fibers, crystalline fibers offer a number of advantages. J. A. Harrington, "Single-crystal fiber optics: a review," SPIE 8959, p. 895902-1, 2014. For example, crystalline fibers typically have an absorption cross section that is an order of magnitude higher than that of a corresponding glass fiber. This not only reduces the required fiber length for lasing but also significantly mitigates the nonlinear issues.

Crystalline fibers also tend to have a much higher thermal conductivity than glass fiber. For example, a crystalline YAG fiber may have a thermal conductivity of about 10 W/m·K, compared to 1.38 W/m·K for silica fiber. This enables better thermal dissipation by the crystalline fiber. Crystalline fibers (particularly Nd/Yb/Er doped YAG fibers) have a much lower nonlinear stimulated Brillouin scattering (SBS) coefficient than that of silica fiber. This substantially reduces detrimental SBS effect and enables a higher power/energy fiber laser. The ultimate scaling potential for an Yb-doped YAG fiber has been estimated to be as high as 16.9 kW, which is about one order of magnitude higher than that of silica-based fiber laser (~1.89 kW). J. Dawson, "Power scaling analysis of fiber lasers and amplifiers based on non-silica materials," SPIE 7686, p. 768611, 2010. Finally, in addition to the potential of enabling higher power/energy fiber lasers and fiber amplifier, crystalline fibers can play an important role in harsh environment high sensitivity and selectivity fiber optic sensors. For example, since the melting temperature of crystalline sapphire fiber is higher than 2000° C., very high temperature (up to 2000° C.) fiber optic temperature sensors may be prepared. S. Yin, P. Ruffin, and F. Yu, *Fiber Optic Sensors*, CRC Press, New York, 2008. Magneto-optic crystalline fibers [e.g., bismuth substituted yttrium iron garnet (Bi:YIG) crystalline fiber] can also enable high sensitivity fiber optic magneto-optic sensors and all-fiber isolators.

Although crystalline fibers offer a great potential for high power/energy fiber lasers as well as harsh environment fiber optic sensors, the performance of current crystalline fiber based lasers or sensors is largely compromised by a lack of a proper crystalline cladding. A proper cladding can not only reduce the scattering loss but also control the number of modes propagated in the fiber. For many applications, such as high beam quality fiber lasers, fewer or single mode operations are preferred. Unfortunately, unlike glass fiber, crystalline fibers are not pulled from a vitreous melt and therefore cladding cannot be readily fabricated in the same way as amorphous glass fibers. In the past several decades, there have been continuous efforts in developing proper cladding on crystalline fiber cores. Although there has been some progress in this field, high quality crystalline cladding and crystalline core optical fibers are still underdeveloped.

BRIEF SUMMARY OF THE INVENTION

We provide liquid phase epitaxy (LPE) methods for preparation of high quality crystalline cladding and crystalline core optical fiber. One embodiment includes the steps of reducing the diameter of crystalline fiber core preform by applying an under-saturated LPE flux, then growing a crystalline cladding layer on the core by introduction of a super-saturated LPE flux. The refractive index of grown cladding layer in a super-saturated LPE flux is different from the thinned crystalline fiber core preform (e.g., lower than the refractive index of the thinned crystalline fiber core) because the material composition of super-saturated LPE flux is different from the composition of under-saturated LPE flux. In this way, the number of modes propagated in the crystalline cladding and crystalline core fiber can be precisely controlled, which enables single or fewer mode crystalline cladding and crystalline core optical fiber.

Further embodiments provide a method of preventing thermal stresses from damaging the fiber during an LPE growing process. These embodiments may include but are not limited to use of pre-bent holding, one-end firm holding, and other holding methods. Further embodiments provide methods for producing crystalline cladding and crystalline core optical fiber by a unique hot isostatic pressing (HIP) method, wherein at least a portion of polycrystalline cladding is transformed into a single crystalline cladding through solid state conversion.

Disclosed herein is a method for forming a crystalline cladding-crystalline core fiber optical system comprising the steps of contacting a molten liquid phase epitaxy (LPE) solution with a crystalline fiber core to grow a crystalline cladding layer thereon, wherein the refractive index of the crystalline cladding layer is lower than the refractive index of the crystalline fiber core.

In one embodiment of the method, the crystalline fiber core is grown by a method selected from the group consisting of laser heated pedestal growth (LHPG) method, micro-pulling, and edge-defined film-fed growth (EFG) method.

In one embodiment of the method, the step of contacting the LPE solution with a crystalline fiber core to grow a crystalline cladding layer thereon comprises holding the crystalline fiber core in the molten LPE solution by a holder to minimize thermally induced stress. The holding step is conducted by a method selected from the group consisting of pre-bent holding technique or one-end firm holding and other end or parts loose holding technique as well as mesh-type bottom support to enhance the strength of holding while allowing molten flux passing through the mesh-type support to achieve a uniform cladding. In one embodiment, multiple working techniques are utilized to minimize thermally induced stress to the crystalline fiber core.

In one embodiment of the method, prior to the cladding growing step, a crystalline fiber core preform is immersed into an under-saturated LPE flux to form the crystalline fiber core having a diameter smaller than the diameter of the crystalline fiber core preform, and the cladding growing step comprises immersing the crystalline fiber core into a super-saturated LPE flux with cladding composition to grow a crystalline cladding layer onto the crystalline fiber core and the refractive index of the crystalline cladding layer is different from the crystalline fiber core (e.g., lower than the refractive index of crystalline fiber core).

In one embodiment of the method, the container is made from a material selected from the group consisting of platinum (Pt), platinum-gold (Pt—Au) alloys, platinum-rhodium (Pt—Rh) alloys, iridium (Ir), platinum-iridium (Pt—Ir) alloys, dispersion-hardened platinum, and dispersion-hardened platinum alloys.

In one embodiment of the method, the fiber holder or crucible moves linearly back and forth along an axial direction of the crystalline fiber core, or the fiber holder or crucible moves linearly back and forth along the direction perpendicular to the axial direction of crystalline fiber core, or the fiber holder or crucible rotates back and forth within an angle of motion of ±90° or a combination thereof. Moreover, the holder is made from a material selected from the group consisting of platinum (Pt), platinum-gold (Pt—Au) alloys, platinum-rhodium (Pt—Rh) alloys, iridium (Ir), platinum-iridium (Pt—Ir) alloys, dispersion-hardened platinum, and dispersion-hardened platinum alloys.

In one embodiment of the method, the molten LPE solution comprises $PbO—B_2O_3$, $BaO—B_2O_3—BaF_2$, $MoO_3—Li_2MoO_4$, and aqueous potassium carbonate ($K2CO3$).

In one embodiment of the method, multiple crystalline cladding-crystalline core optical fiber systems are formed simultaneously.

In one embodiment of the method, prior to or concurrently with immersing the crystalline fiber core preform into the under-saturated LPE flux, reducing the diameter of the crystalline fiber core preform by a method of, for example, lapping and polishing crystalline fiber core preform by moving the crystalline fiber core preform in a lapping and polishing solution comprising diamond, alumina, boron carbide, silicon carbide, colloidal silica, or other lapping/polishing powders, or etching crystalline fiber core preform using hot orthophosphoric acid $H_3PO_4$, hot hydrofluoric acid (HF), hot sulfuric acid ($H_2SO_4$), or a combination thereof, or subsequent to forming the crystalline fiber core but prior to the cladding growing step, reducing the diameter of the crystalline fiber core by a method selected from the group consisting of lapping and polishing crystalline fiber core by moving the crystalline fiber core preform in a lapping and polishing solution comprising diamond, alumina, boron carbide, silicon carbide, colloidal silica, or other lapping/polishing powders, or etching crystalline fiber core preform using hot orthophosphoric acid $H_3PO_4$, hot hydrofluoric acid (HF), hot sulfuric acid ($H_2SO_4$), or a combination thereof.

In another embodiment, a crystalline cladding-crystalline fiber core optical system is formed by contacting a molten liquid phase epitaxy (LPE) solution with a crystalline fiber core to grow a crystalline cladding layer thereon, wherein the refractive index of the crystalline cladding layer is lower than the refractive index of the crystalline fiber core.

In one embodiment, the crystalline cladding and/or the crystalline fiber core of the crystalline cladding-crystalline fiber core optical system contain $(Y_{1-x-y-z},Gd_x,Lu_y,Tb_z)_3(Al_{1-w},Ga_w)_5O_{12}$, where x, y, z, and w are within the range of 0 to 1.

In one embodiment, the crystalline cladding and/or the crystalline fiber core of the crystalline cladding-crystalline core fiber optical system contain dopants selected from the group consisting of erbium, ytterbium, neodymium, thulium, holmium, chromium, cerium, samarium, dysprosium, terbium, titanium, vanadium, magnesium, manganese, iron, cobalt, nickel, copper, bismuth, and combinations thereof.

In one embodiment, the crystalline cladding and crystalline core fiber optical system contain materials selected from the group consisting of pure and/or doped yttrium lithium fluoride (YLF), pure and/or doped yttrium orthovanadate (YVO4), pure and/or doped gadolinium orthovanadate ($GdVO_4$), pure and/or doped colquiriite (LiSaF), pure and/or doped alumina ($Al_2O_3$), pure and/or doped spinel ($MgAl_2O_4$), pure and/or doped aluminum oxynitride (AlON), pure and/or doped yttria ($Y_2O_3$), pure and/or doped zirconia ($ZrO_2$), pure and/or doped aluminum nitride (AlN), pure and/or doped yttrium iron garnet (YIG), pure and/or doped potassium tantalate niobate (KTN), pure and/or doped lithium niobate ($LiNbO_3$), pure and/or doped tantalate niobate ($LiTaO_3$), pure and/or doped lanthanum lead zirconate-titanate (PLZT), pure and/or doped lead magnesium niobate-lead titanate (PMN-PT), and combinations thereof.

In one embodiment, the fiber has multiple cladding layers consisting of an outer (crystalline or amorphous) cladding and an inner crystalline cladding, wherein the refractive index of the outer cladding is lower than the refractive index of the inner crystalline cladding. In one embodiment, an outer metal layer overlays the outer cladding, wherein the outer metal layer is selected from the group consisting of but not limited to silver, aluminum, copper, gold, platinum, titanium, nickel, chromium, and combinations thereof.

In one embodiment, a device comprises the crystalline cladding-crystalline core fiber optical system formed by contacting a molten liquid phase epitaxy (LPE) solution with a crystalline fiber core to grow a crystalline cladding layer thereon, wherein the refractive index of the crystalline cladding layer is lower than the refractive index of the crystalline fiber core, and further wherein the device is selected from the group consisting of fiber lasers, fiber amplifiers, fiber optic sensors, and all-fiber optical isolators.

DETAILED DESCRIPTION OF THE INVENTION

Figure 1:
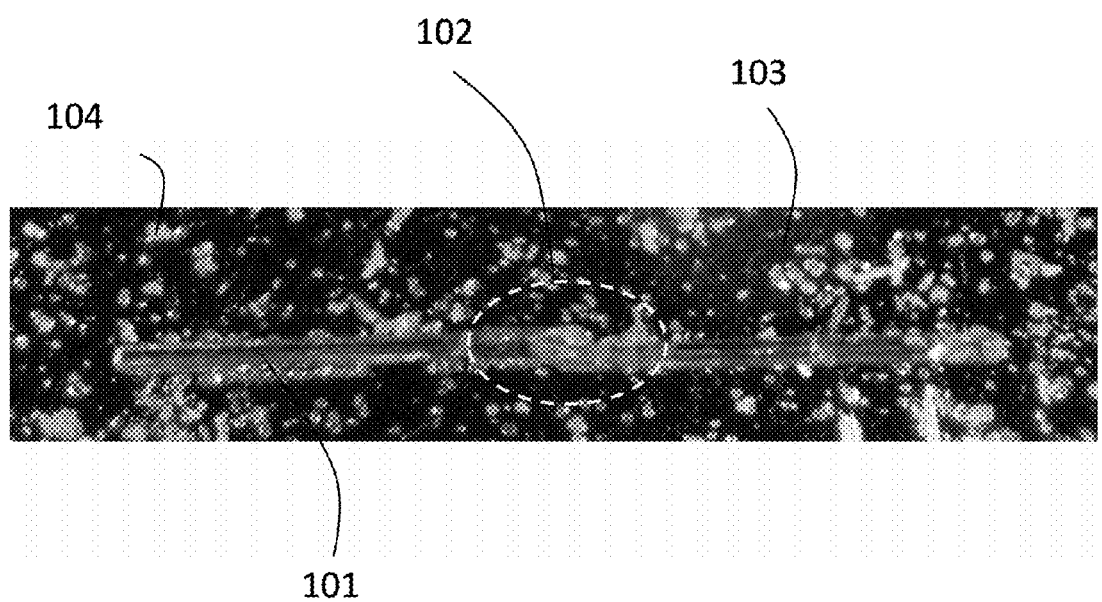
FIG. 1 shows a picture of crystalline YAG fiber 101 that was broken in the area 102 caused by the thermal stress generated during the cooling off process because the fiber 101 was bonded together with the platinum (Pt) holder 103 by the residual flux 104.

In the following detailed description, numerous specific embodiments are set forth to provide a thorough understanding of the apparatus and methods disclosed herein. However, as will be apparent to those skilled in the art, the present embodiments may be practiced without these specific details or by using alternate elements or processes. Embodiments as reported herein may also be combined with each other. In other instances, well-known processes, procedures, and/or components have not been described in detail so as not to unnecessarily obscure aspects of embodiments disclosed herein. As used herein in connection with numerical values the term "about" refers to ±10%.

I. Liquid Phase Epitaxy (LPE)

Embodiments as reported herein may provide methods and apparatus for preparing a crystalline cladding-crystalline core fiber optical system through liquid phase epitaxy (LPE). LPE is a method for growth of crystalline layers from a supersaturated liquid solution (flux) onto a crystalline substrate, including following steps: (1) solution is prepared and supersaturated at a temperature $T_1$, (2) substrate is brought into the contact with supersaturated solution, and (3) crystalline layer is grown on the crystalline substrate. The supersaturated flux can be achieved by cooling a saturated solution or creating a temperature gradient in which the crystalline substrate seed locates at an area that has a temperature lower than that of source area.

Although LPE is useful for crystalline layer growth on rigid planar substrate materials, thus far investigators have found it less useful for grown of crystalline cladding on thin, long fiber cores that might function in fiber lasers and fiber sensors. Unlike a rigid crystalline wafer, thin and long crystalline fiber cores are very fragile and flexible and cannot be easily held in LPE solution by known methods, including for example use of a platinum tricep.

Typically fibers as reported herein are characterized as long and thin fibers. Although not limiting upon the claims unless so stated therein, a "thin" fiber typically has a core diameter from approximately 1 micron to approximately 150 microns and a "long" fiber typically has a length of at least approximately 5 cm.

In embodiments of the invention the refractive index of crystalline cladding is (0.01% to 10%) lower than that of crystalline core; the diameter of crystalline core is within the range of 1 micron to 150 microns, preferably 10 microns to 100 microns; the thickness of crystalline cladding layer is within the range of 1 micron to 1,000 microns, preferably 10 microns to 500 microns; and the length of crystalline cladding and crystalline core fiber is within the range of 1 cm to 10,000 cm, preferably 10 cm and longer.

In various embodiments of the invention, the fiber core may be, for example, pure and/or doped garnet $(Y_{1-x-y-z}, Gd_x, Lu_y, Tb_z)_3(Al_{1-w}, Ga_w)_5O_{12}$, where x, y, z, and w are within the range of 0 to 1, pure and/or doped yttrium lithium fluoride (YLF), pure and/or doped yttrium orthovanadate ($YVO_4$), pure and/or doped gadolinium orthovanadate ($GdVO_4$), pure and/or doped colquiriite (LiSaF), pure and/or doped alumina ($Al_2O_3$), pure and/or doped spinel ($MgAl_2O_4$), pure and/or doped aluminum oxynitride (AlON), pure and/or doped yttria ($Y_2O_3$), pure and/or doped zirconia ($ZrO_2$), pure and/or doped aluminum nitride (AlN), pure and/or doped yttrium iron garnet (YIG), pure and/or doped potassium tantalate niobate (KTN), pure and/or doped lithium niobate ($LiNbO_3$), pure and/or doped tantalate niobate ($LiTaO_3$), pure and/or doped lanthanum lead zirconate-titanate (PLZT), pure and/or doped lead magnesium niobate-lead titanate (PMN-PT), gallium arsenide (GaAs), gallium aluminum arsenide (GaAlAs), gallium nitride (GaN) and combinations thereof. The cladding may be, for example, pure and/or doped garnet $(Y_{1-x-y-z}, Gd_x, Lu_y, Tb_z)_3(Al_{1-w}, Ga_w)_5O_{12}$, where x, y, z, and w are within the range of 0 to 1, pure and/or doped yttrium lithium fluoride (YLF), pure and/or doped yttrium orthovanadate ($YVO_4$), pure and/or doped gadolinium orthovanadate ($GdVO_4$), pure and/or doped colquiriite (LiSaF), pure and/or doped alumina ($Al_2O_3$), pure and/or doped spinel ($MgAl_2O_4$), pure and/or doped aluminum oxynitride (AlON), pure and/or doped yttria ($Y_2O_3$), pure and/or doped zirconia ($ZrO_2$), pure and/or doped aluminum nitride (AlN), pure and/or doped yttrium iron garnet (YIG), pure and/or doped potassium tantalate niobate (KTN), pure and/or doped lithium niobate ($LiNbO_3$), pure and/or doped tantalate niobate ($LiTaO_3$), pure and/or doped lanthanum lead zirconate-titanate (PLZT), pure and/or doped lead magnesium niobate-lead titanate (PMN-PT), gallium arsenide (GaAs), gallium aluminum arsenide (GaAlAs), gallium nitride (GaN) and combinations thereof. The dopants for the core and/or cladding can be selected from the group consisting of aluminum, erbium, ytterbium, neodymium, thulium, holmium, chromium, cerium, samarium, dysprosium, terbium, titanium, vanadium, magnesium, manganese, iron, cobalt, nickel, copper, bismuth, and combinations thereof.

A. Preparation of Crystal and Use of a Holder

Attempts at preparing a thin and long crystalline fiber core in a holder have previously been unsuccessful. Unlike what is effective for rigid crystalline wafers, the adhered flux cannot be spun off by raising the substrate above the melt surface and rotating it at high speed (for example, greater than 300 rpm) and at high flux melting temperature because high speed rotation would break the fragile thin and long fiber core.

Typically a crystalline core is prepared prior to cladding of that core. A crystalline core may be prepared, for example, by one of a laser heated pedestal growth (LHPG) method, micro-pulling, and an edge-defined film-fed growth (EFG) method.

Prior LPE attempts to clad such cores have been unsuitable for many reasons. For example, adhered flux can bond crystalline fiber core and the holder together during the cooling off solidification process. This can break the fiber core due to differences in thermal expansion coefficient (TEC) of holder and the crystalline fiber core. For example, TEC of a platinum holder is about $9 \times 10^{-6}$/K while TEC of yttrium aluminum garnet (YAG) crystalline fiber core is about $6.14 \times 10^{-6}$/K. Such a difference in TEC generates thermally induced stress that can weaken and break the fiber core during the cooling off process. The thermally induced stress increases with axial length of the crystalline fiber core. For example, FIG. 1 illustrates a crystalline YAG fiber core 101 that has broken in area 102 during the cooling off process due to thermally induced stress caused by bonding crystalline fiber core 101 with a platinum holder 103 via residual flux 104.

Figure 2:
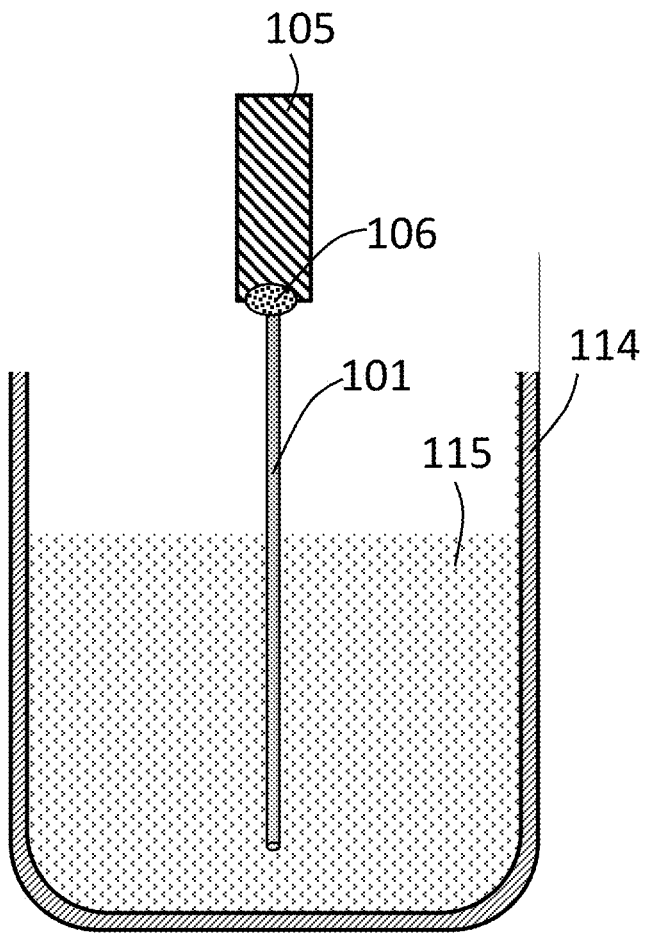
FIG. 2 shows an illustration of vertically holding a crystalline fiber 101 in a molten flux 115, consisting of a crystalline fiber 101, a molten flux 115, a crucible 114, a rigid holder 105, and a high temperature holding component (e.g., a high temperature adhesive) 106.

Although the issue of thermally induced stress may be alleviated by vertically holding the crystalline fiber (e.g., by high temperature adhesive 106) and dipping it into a molten flux, as illustrated in FIG. 2, it is very difficult to achieve a uniform crystalline cladding growth on the crystalline fiber core along the fiber due to the existence of thermal convection and the fluid flux motion caused by density changes in the layer of liquid next to the growing interface [J. M. Robertson, Liquid phase epitaxy of garnets, J. of Crystal growth 45 pp. 233-242, 1978]. Thus, horizontally holding the fiber in a molten flux is preferred. However, the previously reported LPE horizontally holding method is only suitable for holding rigid crystalline wafer but not for the fragile and flexible crystalline fiber core. For example, unlike horizontally holding a rigid crystalline wafer substrate, one cannot horizontally hold a crystalline fiber by holding just one end because the fiber is flexible.

Figure 3:
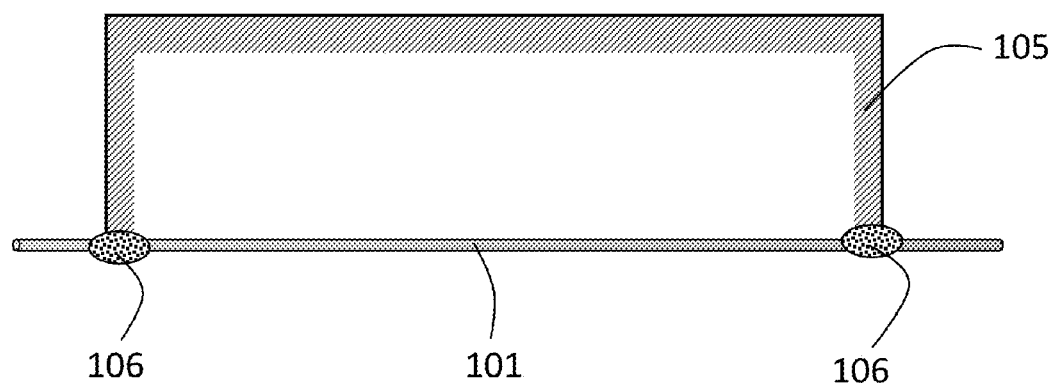
FIG. 3 shows an illustration of an improper method of holding a crystalline fiber 101 in straight by fixing both ends of fiber on a rigid holder 105 (e.g., by using high temperature adhesive 106) that can break the fiber due to the thermally induced stress.

Furthermore, unlike holding a rigid crystalline wafer substrate, the crystalline fiber core 101 cannot be horizontally held straight by fixing both ends of the crystalline fiber core 101 on a rigid holder 105 (for example, by using a high temperature adhesive 106), as illustrated in FIG. 3. Because of differences in TEC between the crystalline fiber core and rigid holder and the very fragile nature of thin and long crystalline fiber, the crystalline fiber can be damaged by thermal stresses generated during temperature ramp-up and/or cooling down in LPE growth. Thus, it is critical to develop proper holding methods which overcome thermal stress problems associated with thin, long crystalline fiber cores.

Figure 4:
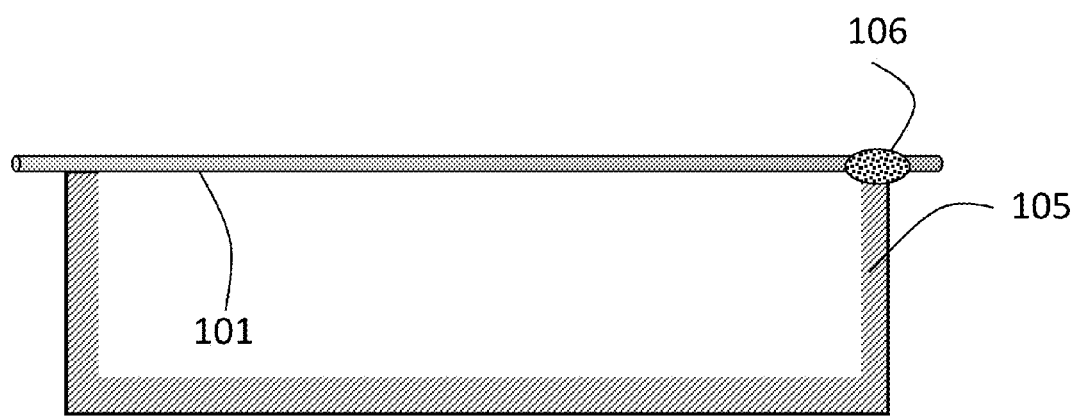
FIG. 4 shows an illustration of a proper method of holding a crystalline fiber core preform 101 in a holder 105 taught by the present invention, in which one of the fiber is firmly fixed on the holder 105 (e.g., by using a high temperature adhesive 106) whereas the other end of fiber can move freely at least in the axial direction so that there will be no or reduced thermally induced stress during the temperature ramp-up and cooling off process.

FIG. 4 illustrates a method of attaching the crystalline fiber core 101 on a holder 105 to properly hold (i.e. with no or reduced thermally induced stress) the crystalline fiber core horizontally in the LPE growing process according to an embodiment of the invention. In this embodiment, one end of the crystalline fiber core is firmly fixed on the holder while a second end moves freely in at least the axial direction.

This axial movement may be permitted, for example, by providing a hole in the second end of holder. The fiber core can pass through the hole. Since the second end of fiber core can move freely in at least the axial direction, it does not generate thermally-induced stresses during temperature ramp-up and/or cooling down during the LPE growing process. This minimizes damage induced by thermal stress.

Figure 5A:
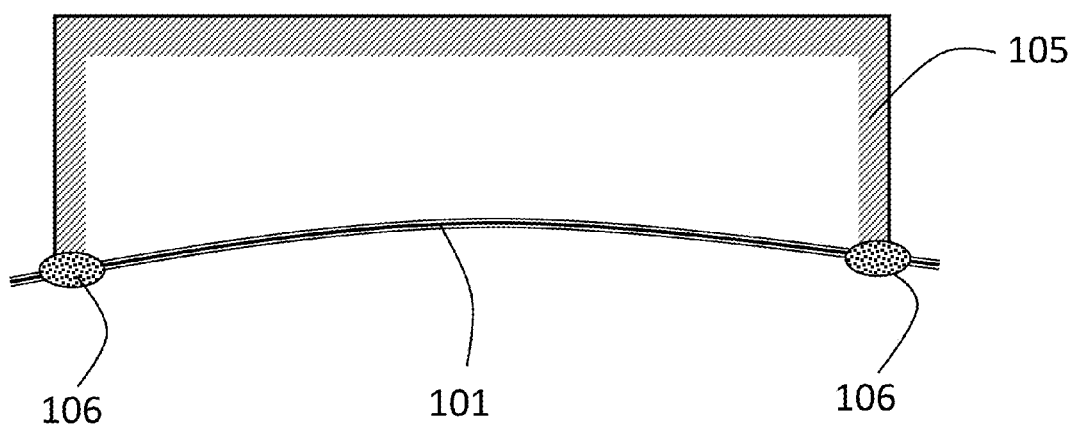
FIG. 5A shows an illustration of another proper method of holding a crystalline fiber core preform 101 in a holder 105 taught by the present invention, in which there is a pre-bent on the fiber although both ends of fiber are firmly fixed on an upper holder. Such a bend can release or reduce the thermally induced stress during the temperature ramp up and/or cooling off in the LPE growing process caused by the difference in thermal expansion coefficients between the crystalline fiber core and the holder.
Figure 5B:
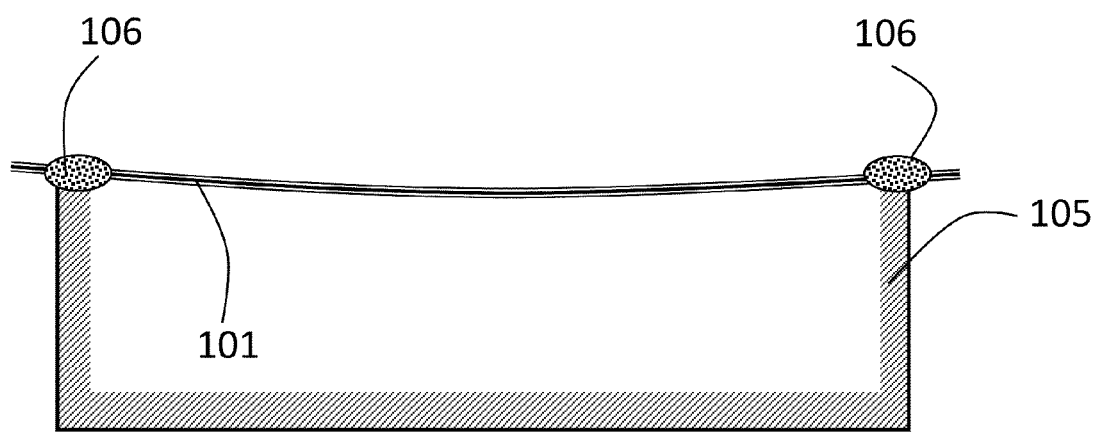
FIG. 5B shows an illustration of another proper method of holding a crystalline fiber core preform 101 in a holder 105 taught by the present invention, in which there is a pre-bent on the fiber although both ends of fiber are firmly fixed on a lower holder. Such a bend can release or reduce the thermally induced stress during the temperature ramp up and/or cooling off in the LPE growing process caused by the difference in thermal expansion coefficients between the crystalline fiber core and the holder.

FIGS. 5A and 5B illustrate another embodiment for attaching the crystalline fiber core 101 on holder 105. In this embodiment both ends of the fiber core are firmly fixed on the holder 105. However, bending the fiber core 101 prior to the LPE process releases or reduces the thermally-induced stress during temperature ramp up and/or cool-down caused by the difference in TEC between the crystalline fiber core 101 and the holder 105.

Figure 5C:
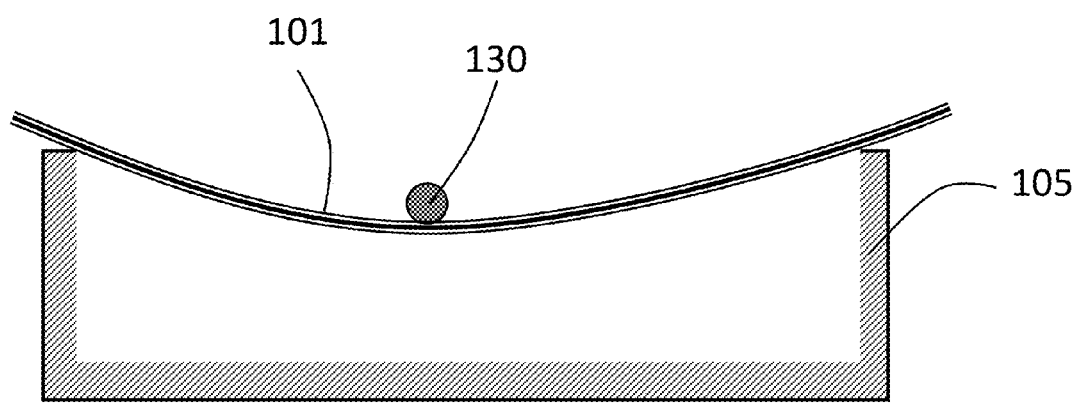
FIGS. 5C and 5D illustrate holding a pre-bend fiber core 101 with a central fixture 130.
Figure 5D:
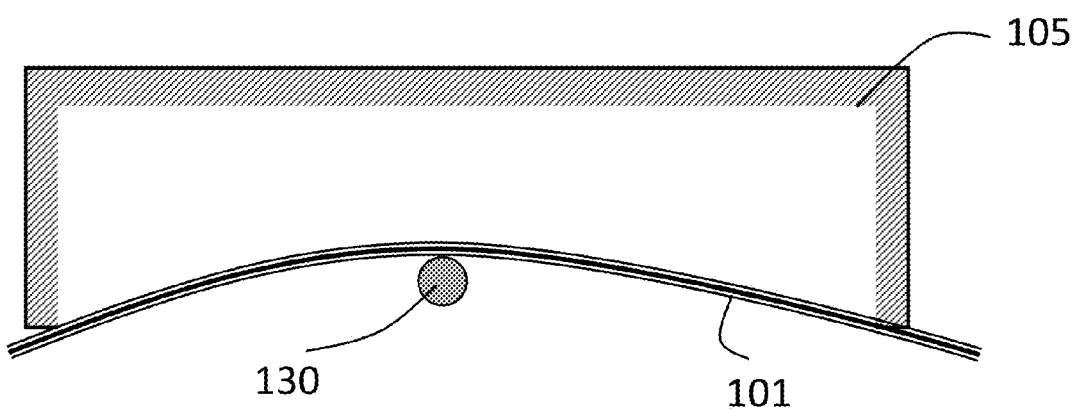

FIGS. 5C and 5D illustrate hold the fiber 101 with a central fixture 130 to reduce the thermal stress. In this embodiment, the firm fix on both ends of fiber may not be needed.

Figure 5E:
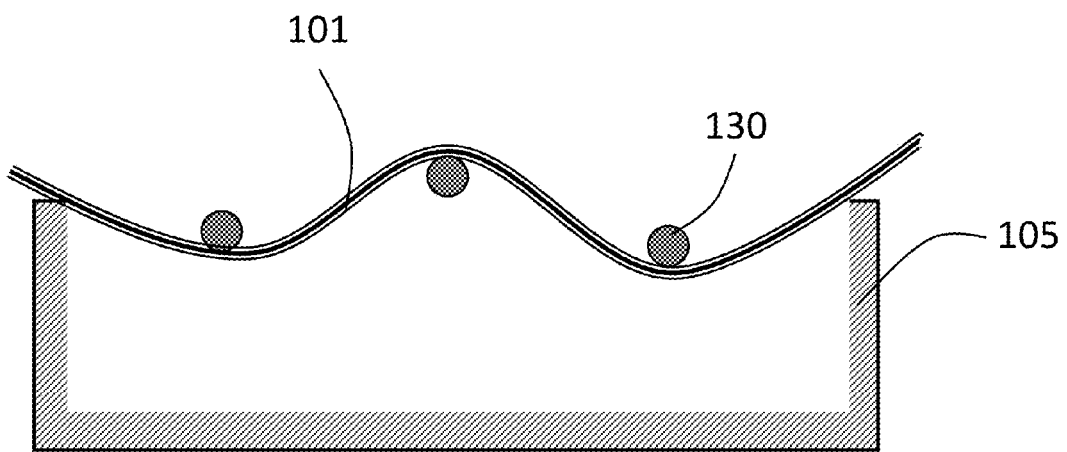
FIGS. 5E and 5F illustrate holding a fiber core 101 with multiple pre-bends by multiple fixtures 130.
Figure 5F:
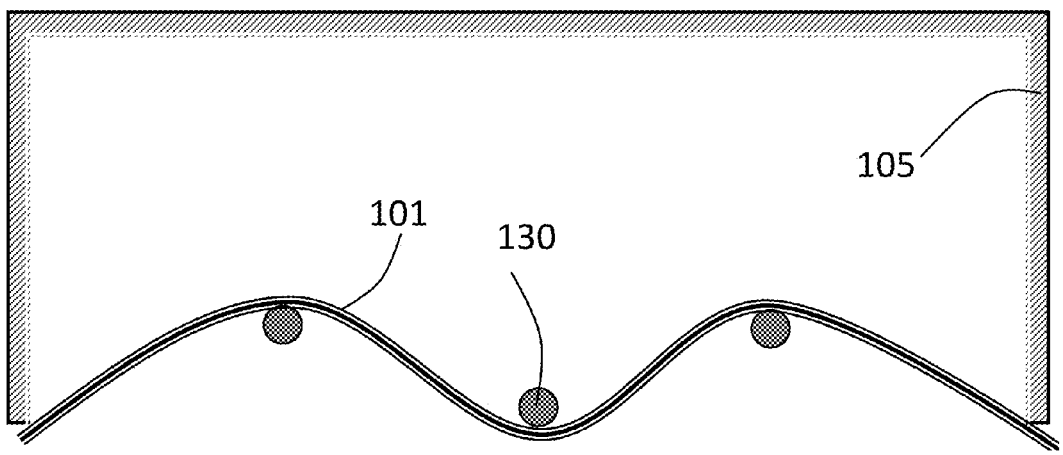

FIGS. 5E and 5F illustrate hold the fiber 101 with multiple pre-bends by multiple fixtures 130 to reduce the thermal stress. Again, in this embodiment, the firm fix on both ends of fiber may not be needed.

Figure 5G:
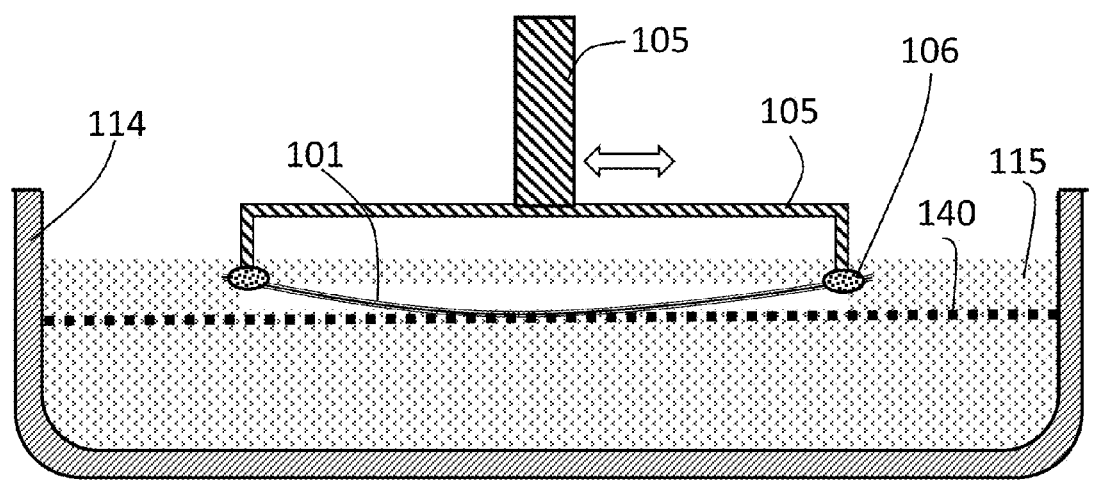
FIG. 5G illustrates another method of holding a crystalline fiber core preform 101 in a holder 105 including a 1-dimensional (1D) or 2-dimensional (2D) mesh-type bottom support 140 that enhances the strength of holding thin and long crystalline fiber core preform.

FIG. 5G shows an illustration of another method of holding a crystalline fiber core preform 101 in a holder 105 including a 1-dimensional (1D) or 2-dimensional (2D) mesh-type bottom support 140 that enhances the strength of holding thin and long fiber core preform. The mesh-type support 140 and crucible 114 are attached together. The molten flux can pass through the mesh type support. Both the fiber core preform 101 and the mesh support are immersed in the molten flux 115 and there is a relative movement between the fiber 101 and mesh-type support 140 in at least fiber axial direction during the LPE growing process, which ensures a uniform cladding growth along the fiber core.

Figure 6:
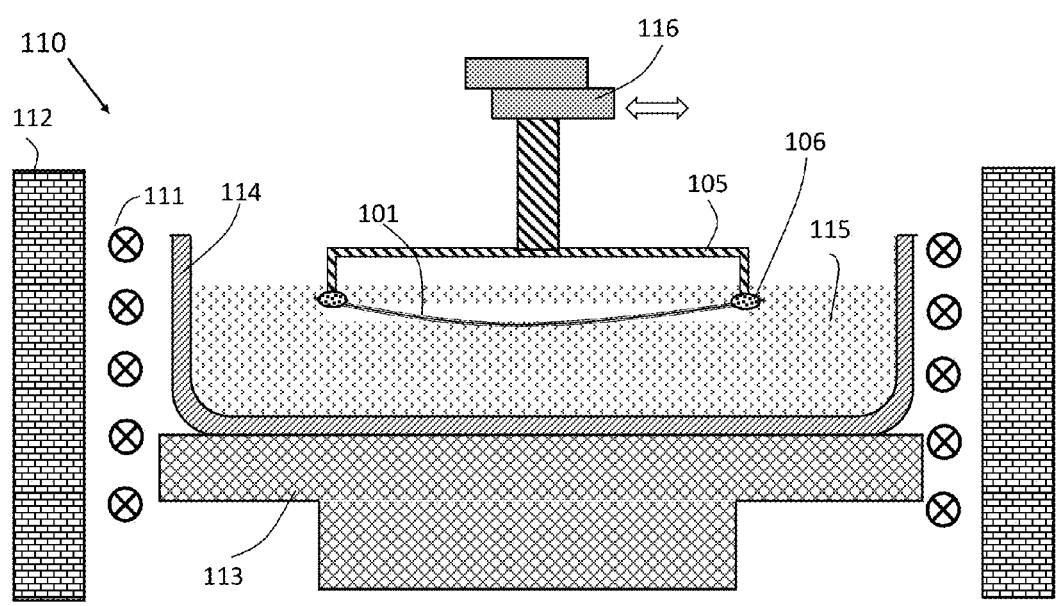
FIG. 6 shows an illustration of a LPE system 110 used to grow the crystalline cladding and crystalline core optical fiber taught by the present invention, which is comprised of (1) a heating element 111 and insulator 112 that can produce the required temperature and temperature distribution for properly melting the LPE flux, (2) a pedestal 113 to hold the growing crucible, (3) a crucible 114, (4) LPE flux 115, (5) a properly held (i.e. with no or reduced thermally induced stress) crystalline fiber core preform 101 that is immersed in the molten LPE flux, and (6) a moving stage 116.

FIG. 6 illustrates an LPE-grown crystalline cladding-crystalline core fiber system 110 used to grow the crystalline cladding upon a crystalline optical fiber core in an embodiment as reported herein. The system includes (1) a heating element 111 and corresponding thermal insulator 112, which produces the required temperature (from about 800° C. to about 1350° C. for fluxes including but not limited to lead oxide-boron trioxide mixture (PbO—$B_2O_3$), a barium oxide-boric oxide-barium fluoride mixture (BaO—$B_2O_3$—$BaF_2$), a molybdenum oxide-lithium molybdate mixture ($MoO_3$—$Li_2MoO_4$), lithium oxide-molybdenum oxide ($Li_2O$—$MoO_3$) and from about 500° C. to about 1000° C. for flux including but not limited to aqueous potassium carbonate ($K_2CO_3$) and temperature distribution profile (uniform and/or a temperature gradient within the range of 0.1° C./cm to 100° C./cm) for properly melting the LPE flux; (2) a pedestal 113 to hold a growing crucible 114; (3) a crucible 114; (4) an LPE flux 115; and (5) a held crystalline fiber core 101 that is immersed into a molten LPE flux 115. The crystalline fiber core 101 is held with no or reduced thermal stress (i.e. properly held) by the methods as illustrated in FIGS. 4, 5A-5G.

In a typical embodiment the holder used to hold the crystalline fiber core is attached to a moving stage and controller 116. This enables the holder to move during the LPE growth process. Or, the holder does not move and the crucible moves. Or, both the holder and crucible move.

The system includes a heating element. The heating element may be, for example, but is not limited to a resistant heating wire, silicon carbide (SiC) heater, platinum (Pt) wire heater, Pt-alloy wire heater, molybdenum disilicide (MoSi2), and combinations thereof. Other types of heating methods may also be employed, either alone or in combination with the heating elements. These include, for example, but are not limited to radio frequency (RF) heating and microwave heating.

The crucible material is selected so that it does not react with the LPE flux. Crucible materials may include, for example, but are not limited to platinum and platinum alloys.

Various crucible shapes may be used. To cost-effectively grow the crystalline cladding on the thin, long crystalline fiber core, the crucible shape typically matches the shape of thin, long crystalline fiber core. This may be, for example, a rectangular, trough-shaped, or boat-shaped crucible.

Crucible size may be minimized by permitting the holder to move linearly along an axial direction of the crystalline fiber core. Crucible size may also be minimized if the holder is permitted to rotate back and forth within an angle of motion of ±90° relative to the fiber core axis. Combinations of linear motion and rotation may also be used.

B. Flux and Growth Processes

A variety of fluxes may be employed in the LPE growing process. These include, for example, but are not limited to a lead oxide-boron trioxide mixture (PbO—$B_2O_3$), a barium oxide-boric oxide-barium fluoride mixture (BaO—$B_2O_3$—$BaF_2$), a molybdenum oxide-lithium molybdate mixture ($MoO_3$—$Li_2MoO_4$), a lead oxide-boron trioxide-lead fluoride mixture (PbO—$PbF_2$—$B_2O_3$), a lead oxide-vanadium pentoxide mixture (PbO—$V_2O_5$), a molybdenum oxide-potassium fluoride mixture (KF—MoO3), a potassium fluoride-barium titanate mixture (KF—$BaTiO_3$), an aqueous potassium carbonate ($K_2CO_3$), a lead oxide-lead fluoride mixture (PbO—$PbF_2$), a lead fluoride-boron trioxide mixture ($PbF_2$—$B_2O_3$), a lithium oxide-molybdenum oxide mixture ($Li_2O$—$MoO_3$), a lead oxide-bismuth oxide mixture (PbO—$Bi_2O_3$), and a molybdenum oxide-potassium molybdate-yttria mixture ($MoO_3$—$K_2MoO_4$—$Y_2O_3$).

Cladding growth ingredients are mixed with flux in an LPE process. For example, in order to grow crystalline YAG cladding layer, yttria ($Y_2O_3$) and alumina ($Al_2O_3$) powders are mixed with the powders of the fluxes. In addition to yttria and alumina, other materials (such as gallium oxide ($Ga_2O_3$), ytterbium oxide ($Yb_2O_3$), neodymium oxide ($Nd_2O_3$), lutetium oxide ($Lu_2O_3$), erbium oxide ($Er_2O_3$), terbium oxide ($Tb_2O_3$), gadolinium oxide ($Gd_2O_3$), and their combinations thereof) may also mix with the powders of fluxes to change the properties of the grown crystalline cladding layer (i.e. refractive index, light emission, light absorption). As another example, by dissolving alumina powder in the flux, sapphire cladding layer can be grown.

The identity of the cladding growth ingredients and the flux will determine the ultimate composition of the cladding. For example, by dissolving yttria ($Y_2O_3$) and alumina ($Al_2O_3$) powders in lead oxide-boron trioxide (PbO—$B_2O_3$) flux, or a barium oxide-boric oxide-barium fluoride (BaO—$B_2O_3$—$BaF_2$) flux, or a molybdenum oxide-lithium molybdate mixture ($MoO_3$—$Li_2MoO_4$) flux, or a lead oxide-boron trioxide-lead fluoride (PbO—$PbF_2$—$B_2O_3$) flux, or a lead oxide-lead fluoride (PbO—$PbF_2$) flux, or a lead fluoride-boron trioxide ($PbF_2$—$B_2O_3$) flux, crystalline YAG can be grown. As another example, by dissolving alumina ($Al_2O_3$) in lithium oxide-molybdenum oxide ($Li_2O$—$MoO_3$) flux, a sapphire crystal can be grown.

A typical LPE growth process includes following steps: (1) mixing flux ingredients and cladding growth ingredients, typically as powders; (2) placing the mixed powders inside a crucible 114; (3) heating the mixed powders to an elevated melting temperature, which is high enough to melt the flux and dissolve the cladding growth ingredients into the flux but lower than the boiling point of the flux for minimizing flux volatilization, to form a melted flux; (4) if necessary, cooling the flux/growth ingredient mixture from saturation temperature to form super-saturated molten flux; for example to grow YAG in a PbO—$B_2O_3$ based flux, $Y_2O_3$ and $Al_2O_3$ powders are dissolved in the PbO—$B_2O_3$ flux at about 1050° C. and maintained at that temperature for a considerable amount of time (e.g. approximately 15 hrs) to reach a homogeneous saturation solution. Then, the super-saturation is realized by cooling the flux from about 1050° C. to about 940° C. As another example, for a $MoO_3$—$Li_2MoO_4$ based flux, due to the low solubility of the flux (e.g., 0.5 mole % at 1100° C. for YAG material), supersaturated flux is created through a suitable temperature gradient (for example, 5-20° C./cm) along the vertical direction of the crucible, which constantly transports source materials from the higher temperature bottom of the crucible to the crystalline fiber core; (5) immersing a held crystalline fiber core 101 with no or reduced thermal stress holding into a super-saturated molten flux 115; (6) growing crystalline cladding on the thin, long crystalline fiber core, including linear movement of the core along an axial direction of the crystalline fiber core; and (7) pulling out the crystalline cladding-crystalline core optical fiber from the crucible after growth while the flux is at the molten status. This allows it to be automatically detached from the crucible.

Figure 7A:
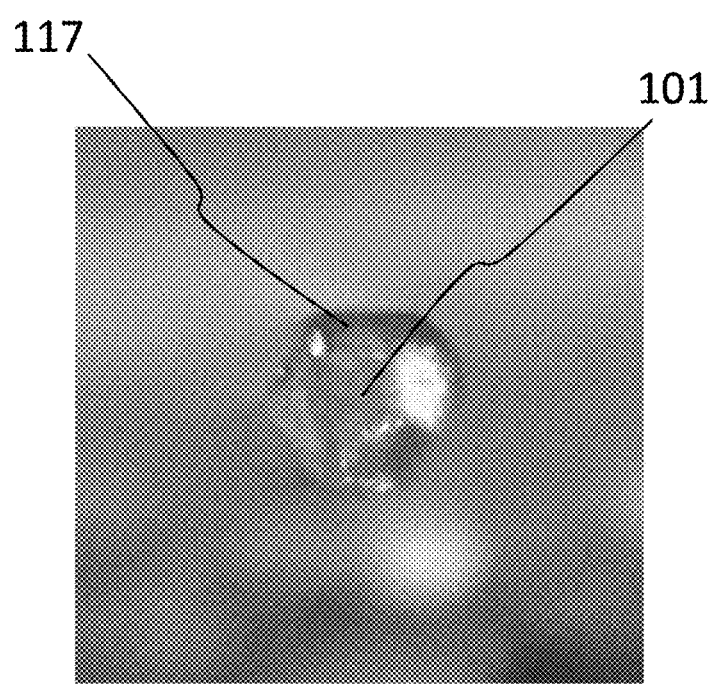
FIG. 7A shows a picture of an end view of a grown crystalline cladding 117 (made of Cr/Nd doped YAG) and crystalline core 101 (also made of Cr/Nd doped YAG but with different concentrations) optical fiber.
Figure 7B:
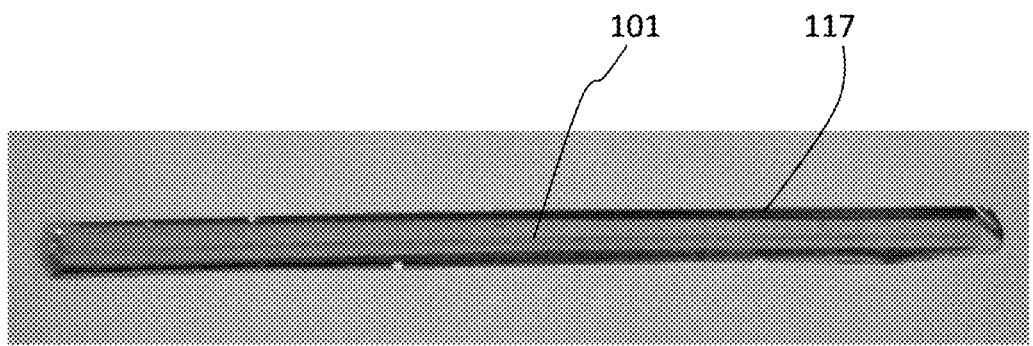
FIG. 7B shows a picture of a side view of a grown crystalline cladding 117 (made of Cr/Nd doped YAG) and crystalline core 101 (also made of Cr/Nd doped YAG but with different concentrations) optical fiber.

FIGS. 7A and 7B illustrate end and side views of a crystalline cladding-crystalline core optical fiber after growth of a chromium (Cr)- and neodymium (Nd)-doped YAG crystalline cladding atop a crystalline fiber core made from doped YAG. The thermal stress free (or reduced thermal stress) held crystalline YAG fiber core (as illustrated in FIGS. 4 and/or 5A-5G) was immersed into a $MoO_3$—$Li_2MoO_4$ based supersaturated flux, containing dissolved yttria and alumina powders, and the crystalline cladding was grown via an LPE growing process to form a crystalline doped YAG fiber core 101 and a crystalline doped YAG cladding layer 117. Unlike the prior art of FIG. 1, there are no breaks in crystalline cladding and crystalline core fiber by employing the thermal stress free (or reduced thermal stress) holding method taught in the present invention.

The thickness of the cladding layer may be controlled in multiple ways. For example, one might alter growing time, growing temperature, or growing temperature gradient of the grown solution. Variations in composition of the growth solution are also possible. For example, to grow YAG, a growth rate of about 0.1 to about 2 micron/min can be achieved by employing PbO—$B_2O_3$ flux and a growth rate of about 0.01 to about 0.2 micron/min can be obtained by harnessing $MoO_3$—$Li_2MoO_4$ flux. Thus, by growing YAG in PbO—$B_2O_3$ flux for approximately 100 minutes, a YAG cladding at least 10 microns thick can be achieved. By growing YAG in $MoO_3$—$Li_2MoO_4$ flux for approximately 1,000 minutes, a YAG cladding at least 10 microns thick can also be obtained.

C. Controlling Modes

To make an efficient fiber laser and/or fiber sensor, single or few mode clad crystalline fiber is preferred for its better-controlled transversal beam profile. Previously reported LPE-based crystalline film growing processes do not teach how to reduce and/or precisely control the number of modes propagated in the crystalline cladding and crystalline core optical fibers.

Embodiments reported herein report methods of reducing and/or precisely control the number of modes propagated in the crystalline cladding and crystalline core optical fibers. First, under-saturated flux is used to reduce the diameter of a crystalline fiber core preform. Subsequently, a super-saturated flux is applied to grow the crystalline cladding atop the reduced diameter crystalline fiber core that has a lower refractive index than that of fiber core.

Figure 8:
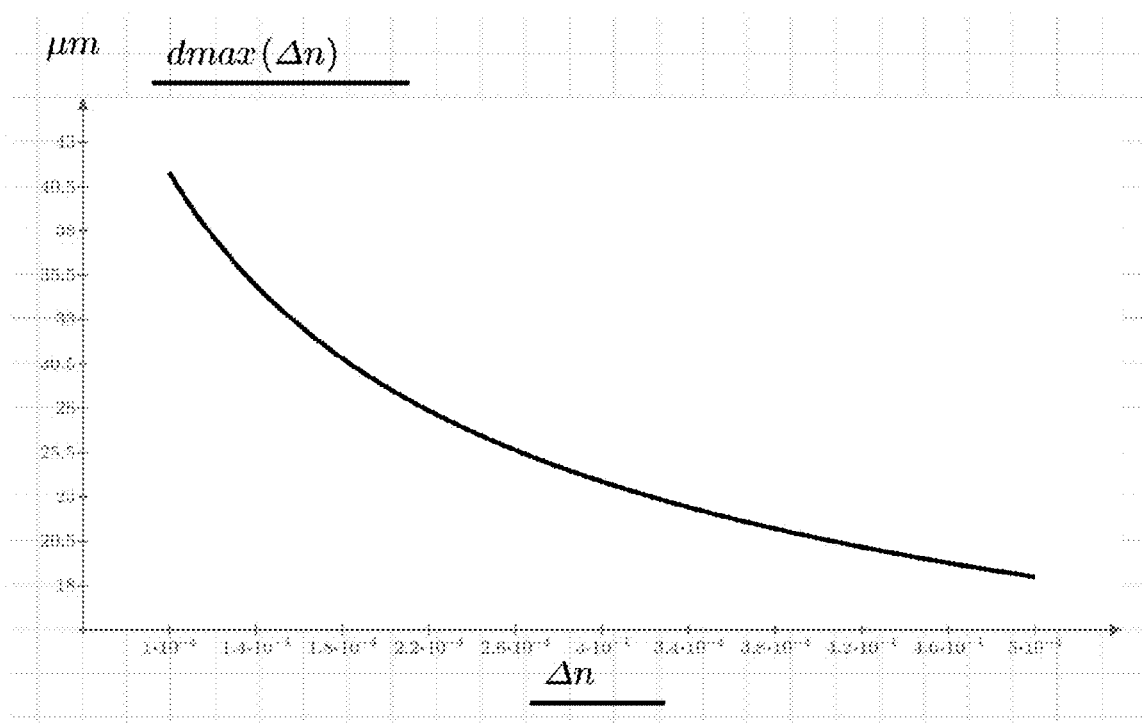
FIG. 8 shows the calculated maximum core diameter, $d_{max}$, for single mode operation as a function of refractive index difference, $\Delta n$, between a crystalline fiber core and a crystalline cladding at an operational wavelength of $\lambda=1030$ nm.

For a single mode crystalline fiber, a maximum core diameter, $d_{co\text{-}max}$, satisfies the following inequality $$d_{co\text{-}max} < \frac{2.405 \cdot \lambda}{\pi \cdot \sqrt{n_1^2 - n_2^2}}, \quad (1)$$

where $\lambda$ is the operational wavelength, and $n_1$ and $n_2$ denote the refractive indices of crystalline fiber core and crystalline cladding, respectively. FIG. 8 illustrates $d_{co\text{-}max}$ as a function of refractive index difference between crystalline fiber core and inner crystalline cladding $\Delta n = n_1 - n_2$. In the calculation, $n_1 = 1.82$ and $\lambda = 1.030$ μm (Yb:YAG lasing wavelength). $d_{co\text{-}max} \approx 20$ μm even for very small refractive index differences (for example, $\Delta n = 4 \times 10^{-4}$).

Refractive index differences between crystalline cladding and crystalline fiber core can be realized by doping. For example, the refractive index of a 4% Yb-doped YAG crystalline fiber core is approximately $4 \times 10^{-4}$ higher than the refractive index of pure crystalline YAG cladding. Current methods, including by laser heated pedestal growth (LHPG), are inadequate to grow long crystalline fiber core preforms (for examples, 1 meter) with small core diameters (for example, 20 μm). Although acid etching may be used to reduce the crystalline fiber core preform diameter, it can damage the surface and increases the scattering loss. To overcome these limitations, we provide an LPE process to reduce or precisely control the number of modes propagated in crystalline cladding and crystalline optical fiber core.

First, we provide an under-saturated LPE flux that reduces the diameter of the crystalline fiber core by dissolving a portion of the crystalline core into the flux. When under-saturated flux is used, the concentration levels of $Y_2O_3$ and $Al_2O_3$ dissolved in the flux are below their saturation levels. Thus, the material of crystalline YAG fiber core consisting of $Y_2O_3$ and $Al_2O_3$ are dissolved in the under-saturated flux such that the diameter of crystalline fiber core is reduced. For example, in one embodiment, when molybdenum oxide-lithium molybdate ($MoO_3$— $Li_2MoO_4$) flux is used to grow YAG crystal, the solubility of $Y_2O_3$ and $Al_2O_3$ is about 0.5 mole % at a temperature of 1050° C. When concentration levels of $Y_2O_3$ and $Al_2O_3$ are above 0.5 mole %, the flux is in a super-saturated state and can grow crystalline YAG thin film on crystalline YAG substrate. When concentration levels of $Y_2O_3$ and $Al_2O_3$ are below 0.5 mole %, the flux is in an under-saturated state. In an under-saturated state, $Y_2O_3$ and $Al_2O_3$ on the crystalline fiber core are dissolved into the flux, resulting in a thinned diameter of crystalline fiber core and a smoother surface relative to the original crystalline fiber core.

Subsequent to the under-saturated LPE flux treatment, the thinned core is treated through a super-saturated LPE flux. The supersaturated flux grows a crystalline cladding layer on the thinned crystalline fiber core. As an example of current invention, one can use two crucibles (or one crucible with two compartments) to realize this goal. One crucible (or one compartment) holds under-saturated flux and the other one holds super-saturated flux. The crystalline fiber core is first immersed in the under-saturated flux to reduce the core diameter and then immersed in the super-saturated flux to grow the crystalline cladding on the thinned crystalline fiber core. Furthermore, the material composition of super-saturated flux can be different from the under-saturated flux or crystalline fiber core so that the refractive index of grown crystalline cladding is different from the fiber core (e.g., lower than that of fiber core). For example, the crystalline fiber core preform may be Yb:YAG.

First, the Yb:YAG preform is immersed into an under-saturated flux that may contain $Y_2O_3$, $Al_2O_3$, or $Yb_2O_3$ at a concentration level less than the saturation level. Thus, the $Y_2O_3$, $Al_2O_3$, and $Yb_2O_3$ in fiber core preform are dissolved in the under-saturated flux so that the diameter of Yb:YAG preform is reduced. Then, the thinned Yb:YAG fiber core is immersed in the super-saturated flux. The super-saturated flux may only contain $Y_2O_3$ and $Al_2O_3$ but not $Yb_2O_3$. In this case, only pure YAG cladding is grown atop of Yb:YAG core. Since the refractive index of pure YAG is lower than that of Yb:YAG, the refractive index of crystalline cladding is lower than that of crystalline fiber core. Because the crystalline fiber core has a reduced diameter, the number of modes propagated in the crystalline cladding and crystalline core optical fiber are reduced. Alternatively, since saturation level is a function of temperature, one may use only one crucible to realize the goal. First, the flux is at saturation status at a temperature $T_2$. Second, we increase the temperature from $T_2$ to a higher temperature $T_3$ so that the flux is changed from saturation status to under-saturated status. The crystalline fiber core is immersed into the under-saturated flux at temperature $T_3$ for reducing the fiber core diameter. Third, the temperature of flux is reduced from $T_3$ to a lower temperature $T_1$ that is less than $T_2$. Flux becomes super-saturated so that cladding layer can be grown on the thinned fiber core at temperature $T_1$. An advantage of this approach is that it only needs one crucible or one compartment. However, it has less control on the composition as well as refractive index of crystalline cladding.

In one embodiment, the diameter of a Yb:YAG crystalline fiber core preform, grown by LHPG method, is reduced from about 100 μm to about 20 μm by immersing the preform into an under-saturated LPE flux. For example, in one embodiment, when the concentration of dissolved materials (i.e. $Y_2O_3$ and $Al_2O_3$) are below the saturation levels (i.e. <0.5 mole % for $MoO_3$—$Li_2MoO_4$ based flux at 1050° C.), the flux is under-saturated. Then, a pure YAG crystalline cladding is grown on this thinned diameter Yb:YAG crystalline fiber core, thus forming a single-mode crystalline cladding-crystalline fiber core optical system operating at a wavelength of 1030 nm.

Figure 9:
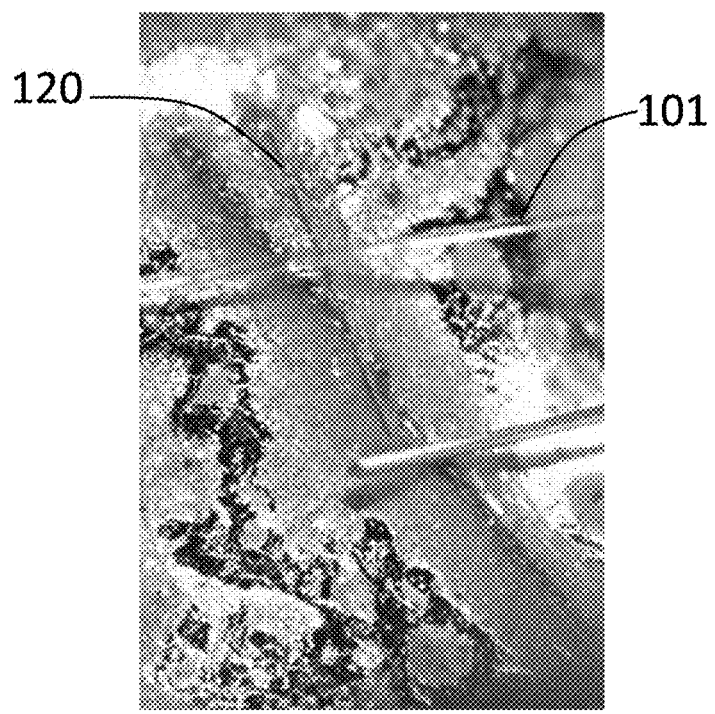
FIG. 9 shows a picture of single crystalline YAG fiber core with a thinned 20 μm diameter 120 by immersing a 100 μm crystalline YAG fiber core preform 101 into an undersaturated $MoO_3$—$Li_2MoO_4$ flux at 1100° C. for 3 hrs.

In one example, a single crystalline YAG fiber core preform with a diameter of approximately 100 μm was immersed in a $MoO_3$—$Li_2MoO_4$ under-saturated flux at a temperature of about 1100° C. for 3 hours. A thinned crystalline fiber core 120 having a smooth surface and a diameter of about 20 μm was formed, as shown in FIG. 9. Such diameters are sufficiently thin to enable single mode operation when a refractive index difference between the crystalline cladding and crystalline fiber core is $\leq 4\times 10^{-4}$ and the operational wavelength is at 1030 nm or longer.

Although embodiments have been reported herein with a crystalline fiber core and a crystalline cladding, there can be one or more layers of outer cladding atop crystalline cladding layer. The outer cladding layers can be crystalline layer or amorphous layer. Furthermore, the outer cladding layer can also be metal layer. The outer metal layer may be, for example, but is not limited to silver, aluminum, copper, gold, platinum, titanium, chromium, nickel, and combinations thereof.

D. Pre-Bending Fibers

In a further embodiment, a thin, long clad crystalline fiber may be prepared from LPE with the assistance of pre-bending the fiber for reducing the thermally induced stress, as illustrated in FIGS. 5A-5G. For example, to make a bend, first, we firmly fix one end of fiber on the holder (e.g., by high temperature adhesive). Then, we apply a pressure on the fiber core in the direction perpendicular to the fiber axis to bend the fiber. The length of the bent fiber will be at least 0.01% longer than the corresponding straight fiber. While maintaining the bending status with the applied pressure, we firmly fix the other end of fiber (e.g., by high temperature adhesive). In addition, by employing a central fixture 130, the firm holds on both ends of fiber 101 may not be need, as illustrated in FIGS. 5C and 5D. Furthermore, there can also be multiple pre-bends in the crystalline fiber as illustrated in FIGS. 5E and 5F. Moreover, there can be mesh-type bottom support to enhance the holding of the fiber, as illustrated in FIG. 5G.

E. Clad Crystalline Fibers

Clad crystalline fibers prepared by methods reported herein may have a number of properties. First, it has a crystalline fiber core and at least one layer of crystalline cladding. Second, the thickness of crystalline cladding layer is at least 1 micron and the crystalline cladding has a smooth and crack free (or minimum crack) surface. Third, the crystalline cladding should wrap the entire side surface of crystalline fiber core. Fourth, the diameter of crystalline fiber core should be less than 150 microns and the length of crystalline cladding and crystalline core fiber should be longer than 5 cm. Fifth, the refractive index of crystalline cladding layer is lower than that of crystalline fiber core.

II. Hot Isostatic Pressing (HIP)

Another embodiment pertains to a method and apparatus of producing a crystalline cladding-crystalline core fiber optical system using hot isostatic pressing (HIP). This method typically includes the following steps: (1) growing a single crystalline fiber core preform; (2) sintering a transparent polycrystalline microtube by high vacuum sintering, wherein the refractive index of polycrystalline microtube is lower than the refractive index of a single crystalline fiber core; (3) integrating the single crystalline fiber core and polycrystalline microtube together via HIP to form a unitary clad crystalline fiber; and (4) improving transmittance of the polycrystalline cladding layer via high temperature solid state conversion (SSC).

Initially, single crystalline fiber core preforms are grown using at least one growing technique, including laser heated pedestal growth (LHPG) method, micro-pulling, and edge-defined film-fed growth (EFG) method. The diameter of crystalline fiber core preform may be further reduced after growing by immersing it into under-saturated liquid phase epitaxy (LPE) flux (for example, under-saturated $Li_2MoO_4$—$MoO_3$ flux) or etching acid (for example, $H_3PO_4$ acid) before adding the crystalline cladding layer.

In some embodiments, transparent polycrystalline (for example, YAG) microtubes are produced by high vacuum sinter, similar to sintering techniques employed for aluminum oxynitride (AlON), spinel ($MgAl_2O_4$), alumina ($Al_2O_3$) transparent polycrystalline microtubes.

The fabrication of transparent polycrystalline YAG microtubes may include the following steps: (1) formulating YAG powder mixture; (2) formulating YAG paste; (3) extruding YAG paste into a microtube shape paste preform; (4) fabricating the microtube shape YAG preform; and (5) converting the microtube shape YAG preform into transparent polycrystalline YAG microtube via high vacuum sintering.

In one embodiment, a YAG powder mixture was formulated by weighting and mixing high purity grade (>99.99%) sub-micron yttrium oxide ($Y_2O_3$) and aluminum oxide ($Al_2O_3$) powders. To obtain the YAG phase, Y:Al ratio was 3:5. A high-purity tetraethoxysilane (TEOS, 99.9999%) containing 0.14 wt % $SiO_2$, was added as a sintering aid. The powder mixture was milled in 95% ethanol for 24 hrs with high purity alumina balls and dried in a vacuum oven at 80° C. for 24 hrs.

The YAG paste was formulated by mixing the powder mixture with 50 wt % thermoplastic binder (e.g., low density polyethylene (LDPE)) to form the doped-YAG paste. The YAG paste was then extruded into a microtube shape at 150° C. and subsequently, the microtube shape YAG paste was converted into microtube shape YAG preform by pre-sintering the paste at 1200° C. for 4 hrs in air to burn out organic binder. Finally, the microtube shape YAG preform was sintered into transparent polycrystalline YAG microtube at 1650° C. for 8 hrs in a high vacuum chamber ($<10^{-5}$ Pa). Transparent polycrystalline YAG microtube can be obtained within a temperature range of approximately 1600° C. to approximately 1800° C. and a time range of approximately 0.1 hr to approximately 1,000 hrs. Also, above process can also be used to fabricate other pure and/or doped crystalline materials including but not limited to pure and/or doped garnet $(Y_{1-x-y-z}, Gd_x, Lu_y, Tb_z)_3(Al_{1-w}, Ga_w)_5O_{12}$, where x, y, z, and w are within the range of 0 to 1, pure and/or doped yttrium orthovanadate ($YVO_4$), pure and/or doped gadolinium orthovanadate ($GdVO_4$), pure and/or doped alumina ($Al_2O_3$), pure and/or doped spinel ($MgAl_2O_4$), pure and/or doped aluminum oxynitride (AlON), pure and/or doped yttria ($Y_2O_3$), pure and/or doped zirconia ($ZrO_2$), pure and/or doped aluminum nitride (AlN), pure and/or doped yttrium iron garnet (YIG). The dopants for the core and/or cladding can be selected from the group consisting of erbium, ytterbium, neodymium, thulium, holmium, chromium, cerium, samarium, dysprosium, terbium, titanium, vanadium, magnesium, manganese, iron, cobalt, nickel, copper, bismuth, and combinations thereof.

After growing the single crystalline fiber core preform (and optionally thinned to form a single crystalline fiber core by using under-saturated flux method and/or acid etching) and fabricating the transparent polycrystalline YAG microtube, the single crystalline fiber core and polycrystalline microtube are integrated together by HIP to form a unitary clad crystalline fiber, comprising a polycrystalline cladding and a single crystalline optical fiber core.

Figure 10:
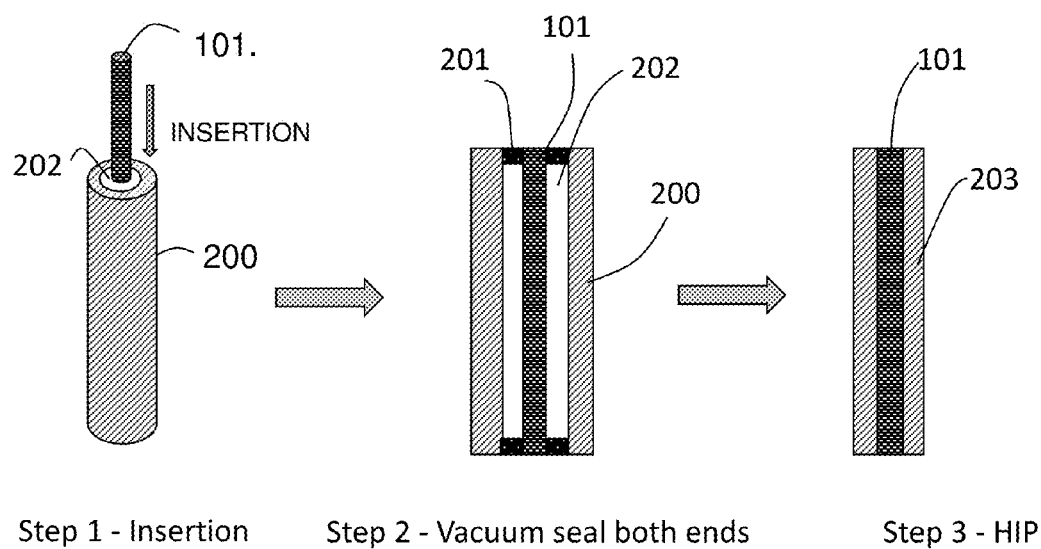
FIG. 10 shows a conceptual illustration of processes for integrating single crystal fiber core and polycrystalline microtube together by the HIP method.

Typical HIP process steps are illustrated in FIG. 10. First, a single crystalline fiber core 101 is inserted into a transparent polycrystalline YAG microtube 200. Second, the single crystalline fiber core and polycrystalline microtube are vacuum sealed at both ends 201 (for example, by melting the ends via $CO_2$ laser illumination in vacuum). Because the densely packed polycrystalline microtube has no open porosity and is impermeable to the pressuring gas, it may be used as an air-tight container for HIP processing. Finally, HIP is conducted in a non-reactive pressurized gas environment (for example, in argon gas or other gases as long as they do not react with the crystalline fiber core and polycrystalline microtube) at a temperature less than the melting temperature of the single crystalline fiber core but greater than the softening temperature of the polycrystalline microtube.

In one embodiment, the following parameters are used to integrate polycrystalline YAG microtubes with single crystalline YAG fiber cores via HIP to form unitary clad crystalline fibers: (1) argon carrier gas (or other gases as long as they do not react with the crystalline fiber core and polycrystalline microtube); (2) pressure: about 0.2 MPa to about 10,000 MPa; and temperature: about 1600° C. to about 1800° C. This temperature is less than the melting temperature of single crystalline YAG fiber core (approximately 1970° C.), but greater than the softening temperature of polycrystalline YAG microtube. Thus, the gap 202 between the single crystalline fiber core and polycrystalline microtube is collapsed during the HIP process. After the HIP process, the polycrystalline microtube 200 is converted into polycrystalline cladding 203.

Finally, to further increase the transmittance of polycrystalline cladding, a solid state conversion (SSC) process converts the polycrystalline cladding into single crystalline cladding. The single crystalline core serves as the seed to realize the solid state conversion. Since the domain boundary scattering of polycrystalline cladding is eliminated after the SSC process, scattering loss is reduced and the transmission is increased. Selection of an effective temperature is dependent upon material, for example, the optimum solid state conversion temperature is about 1700° C. to about 1800° C. for YAG crystal and about 1700° C. to about 2000° C. for sapphire crystal.

Figure 11:
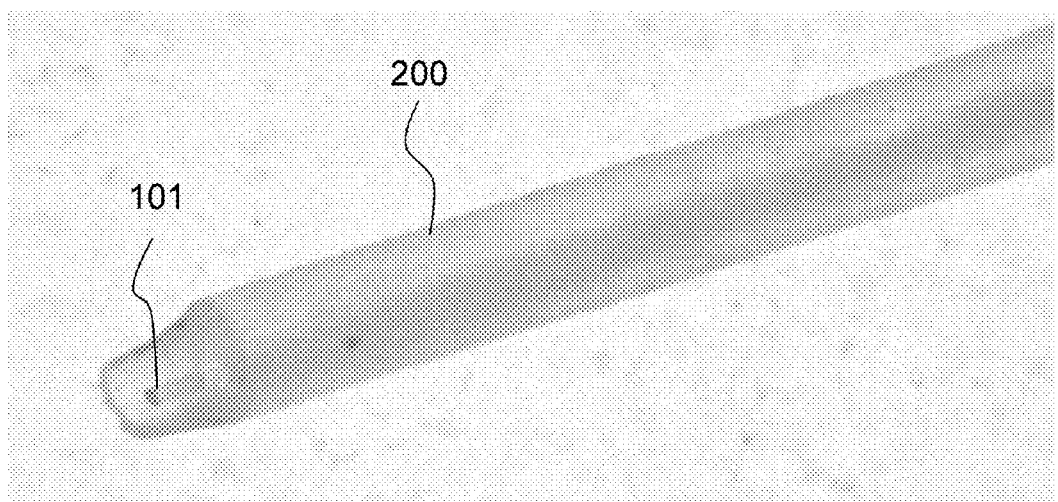
FIG. 11 shows a picture of 1% Yb doped YAG single crystalline fiber core 101 inserted into a transparent pure YAG polycrystalline microtube 200.

In one embodiment, a 1% Yb-doped YAG single crystalline fiber core was grown by the LHPG to a diameter approximately 100 μm. A pure YAG polycrystalline microtube was also produced by the high vacuum sintering method. The inner and outer diameters of the YAG polycrystalline microtube were approximately 200 μm and 600 μm, respectively. The diameter of crystalline fiber core can be within the range of approximately 10 to approximately 500 microns. The inner diameter of polycrystalline microtube can be within the range of approximately 10 to approximately 2,000 microns as long as the inner diameter of polycrystalline microtube is larger than the diameter of crystalline fiber core. There is no limitation of outer diameter of polycrystalline microtube. The refractive index of the pure YAG polycrystalline microtube was about $1 \times 10^{-4}$ less than the refractive index of the 1% Yb-doped YAG single crystalline fiber core. Since the diameter of the crystalline fiber core was less than the inner diameter of the polycrystalline microtube, the 1% Yb-doped YAG single crystalline fiber core 101 was able to be inserted into the pure YAG polycrystalline microtube 200, as shown in FIG. 11. After that, both ends of the 1% Yb-doped YAG single crystalline fiber core and pure YAG polycrystalline microtube were sealed together by $CO_2$ laser illumination under vacuum. The sealed sample was put in a HIP furnace and treated in a non-reactive argon gas (or other non-reactive gases) environment at a pressure within a range of about 0.2 MPa to about 10,000 MPa, a temperature within a range of about 1600° C. to about 1800° C., and a time within a range of about 0.1 hr to about 10,000 hrs. After completion of the HIP process, the sample was treated in a high-vacuum furnace at a temperature within a range of about 1700° C. to about 1800° C. for YAG and about 1700° C. to about 2000° C. for sapphire and a time within a range of about 0.1 hr to about 10,000 hrs for solid state conversion.

Figure 12:
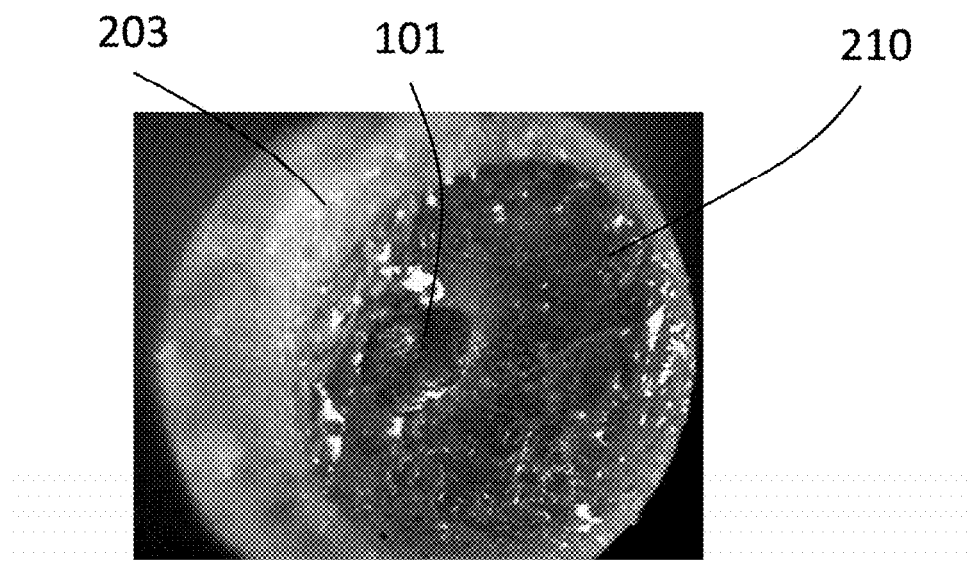
FIG. 12 shows a picture of solid state converting a portion of polycrystalline cladding 203 into a single crystalline cladding 210.

FIG. 12 illustrates the result after solid state conversion. A portion of polycrystalline cladding near the single crystalline fiber core 101 was converted into single crystalline cladding 210 while other portions of polycrystalline cladding located a distance further from the single crystalline fiber core 101 than the single crystalline cladding 210 was maintained in a polycrystalline state 203. Finally, high pressure may also be combined with the liquid phase crystal growing method to reduce the growing temperature during the liquid phase crystal growing process.

III. Applications for Crystalline-Cladding and Crystalline-Core Fiber

The crystalline cladding-crystalline core fiber optical system fabricated by methods disclosed herein have many different applications. These include, for example, but are not limited to fiber lasers, fiber amplifiers, fiber optic sensors, and all-fiber optical insulators.

Figure 13:
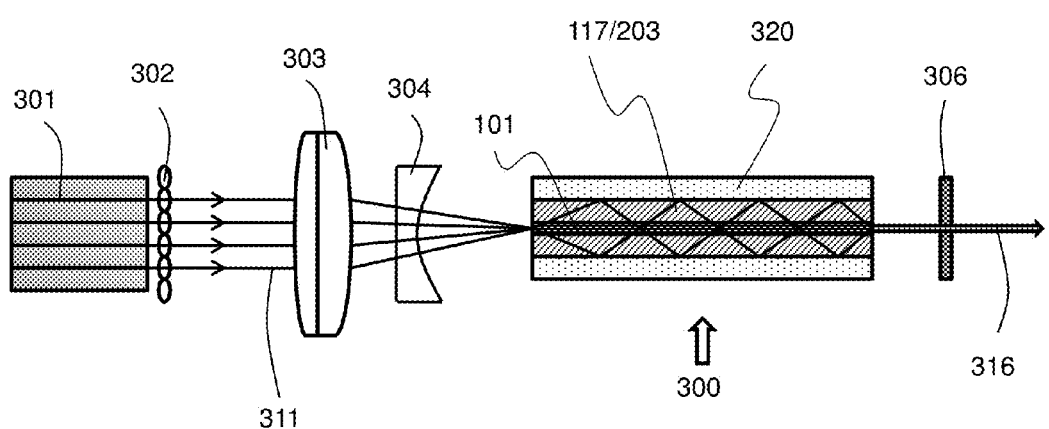
FIG. 13 shows a schematic drawing of a cladding pumped fiber laser based on the crystalline cladding and crystalline core optical fiber taught by the present invention.

FIG. 13 illustrates a cladding pumped fiber laser, in which the crystalline cladding and crystalline core optical fiber serves as a lasing medium. In this application, the crystalline cladding serves as an inner cladding. Optionally, a thin outer cladding (for example, less than 10 μm) may be included whose refractive index is lower than the refractive index of the inner cladding. Because the outer cladding is very thin, thermal conductivity does not create much heat dissipation issues and can be made from either crystalline or amorphous materials.

The cladding pumped fiber laser includes a pump laser 301 that emits a pump laser beam 311 at pump wavelength $\lambda_{pump}$, a pump laser beam collimator 302, a focusing lens 303 that focuses the pump laser beam 311 into inner crystalline cladding 117/203 and crystalline fiber core 101, a dichroic mirror 304 that transmits pumping wavelength $\lambda_{pump}$ and reflects lasing wavelength a crystalline cladding and crystalline core optical fiber 300 that consists of a crystalline fiber core 101, a crystalline inner cladding 117/203, and a thin outer cladding 320, and an output coupler 306 that partially reflects the lasing wavelength $\lambda_{lasing}$. The dichroic mirror 304 and output coupler 306 form a laser resonant cavity. An output laser beam 316 emits out from the output coupler 306. Since heat is easily transferred out by the high thermal conductivity crystalline core and crystalline inner cladding, a high power/energy fiber laser can be realized by using the crystalline cladding and crystalline core fiber disclosed herein. To reduce reflection loss, antireflection coating for the pumping wavelength may optionally be added on end surfaces of both the crystalline cladding and crystalline core optical fiber.

Figure 14:
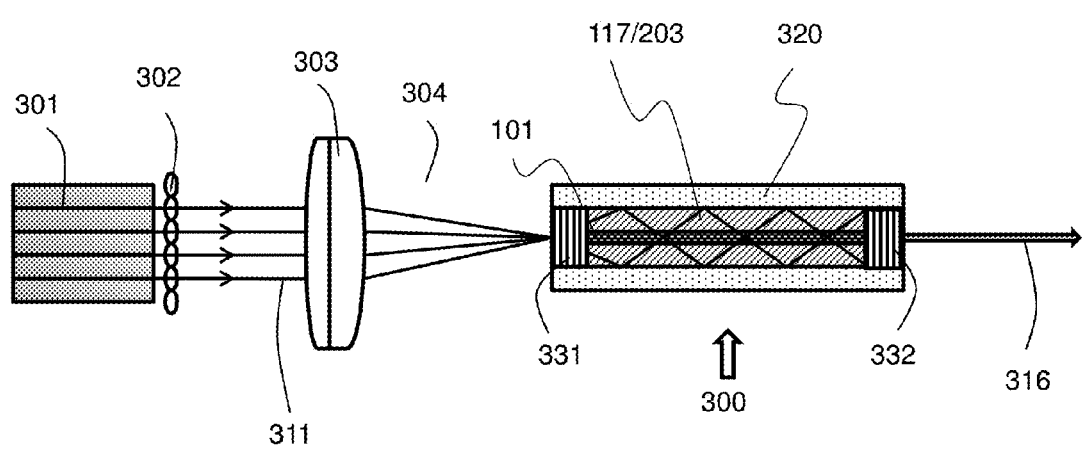
FIG. 14 shows a schematic drawing of a cladding pumped fiber laser including the in-fiber Bragg gratings in crystalline cladding and crystalline core optical fiber.

A modified cladding pumped fiber laser is formed by replacing the dichroic mirror 304 and/or output coupler 306 with in-fiber Bragg gratings. A total-reflection Bragg grating 331 reflects the lasing wavelength and a partial-reflection Bragg grating 332 partially reflects the lasing wavelength as illustrated in FIG. 14. Such in-fiber Bragg gratings can be inscribed in the crystalline fiber core by femtosecond laser illumination.

Figure 15:
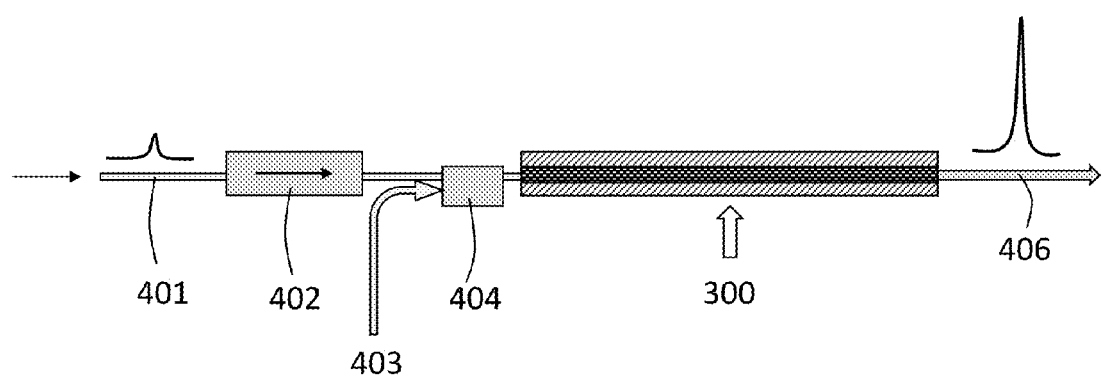
FIG. 15 shows a schematic drawing of fiber amplifier based on crystalline cladding and crystalline core optical fiber.

FIG. 15 illustrates a high efficiency fiber amplifier based on the crystalline cladding-crystalline core fiber optical system disclosed herein. An incoming signal beam 401 first passes through an isolator 402 and then both the signal beam 401 and pumping beam 403 are coupled into the crystalline cladding and crystalline fiber core 300 via a dichroic coupler 404. The crystalline fiber core is doped and absorbs the pumping wavelength light, thereby emitting a signal wavelength light. Thus, an amplified signal beam 406 can be obtained.

Figure 16:
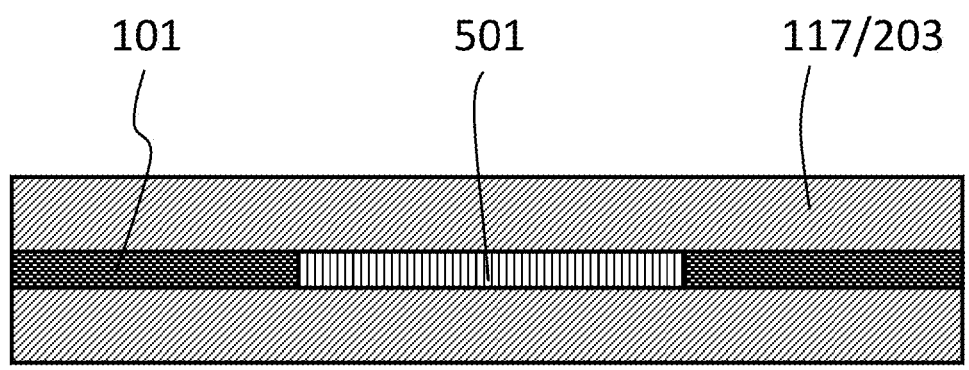
FIG. 16 shows a schematic drawing of a high performance fiber optic sensor based on in-fiber Bragg gratings inscribed in the crystalline cladding and crystalline core optical fiber.

FIG. 16 illustrates a high selectivity and sensitivity harsh environment fiber optic sensor using the crystalline cladding-crystalline core fiber optical system disclosed herein. A harsh environment sensor should work at an ambient temperature over 1000° C. and robust against chemical attacks at this elevated temperature. The high selectivity means that a sensor can be designed to sense a particular measurand (e.g., temperature or pressure) and a high sensitivity means that, in terms of temperature sensor it can have a sensitivity better than 1% of sensing range. Since crystalline cladding and crystalline core fibers (for example, sapphire and YAG) have high melting temperatures (for example, at least 1800° C.) and are highly robust against chemical attacks, harsh environment high temperature fiber optic sensors can be developed. Furthermore, since fewer even single mode operation can be achieved by employing the crystalline cladding-crystalline-core fiber optical system disclosed herein, a high performance fiber optic sensor can be fabricated from a well-controlled light beam profile. Sensitivity and selectivity are further improved by creating micro/nano structures on fiber. For example, by inscribing in-fiber Bragg grating 501 in the crystalline fiber core 101 and/or crystalline fiber cladding 117/203, a high selectivity and sensitivity harsh environment fiber optic sensor can be realized.

For the disclosed devices according to fabrication methods disclosed herein, Bragg resonant wavelength, $\lambda_B$, can be written as:

$$m \cdot \lambda_B = 2 n_{eff} \Lambda, \qquad (2)$$

wherein m is an integer, $n_{eff}$ is the effective refractive index of the fiber core, and $\Lambda$ denotes the period of Bragg grating. Changes in temperature and/or pressure changes the effective refractive index $n_{eff}$ and/or grating period $\Lambda$, which consequently changes the Bragg wavelength $\lambda_B$. Thus, by measuring the shifts of Bragg wavelength (for example, by a compact spectrometer), the changes in temperature and pressure can also be determined. In addition to Bragg grating, the long period grating (LPG) that couples the core and cladding mode can also be inscribed in the crystalline core and cladding fiber to further enhance the sensitivity of fiber optic sensors.

Figure 17:
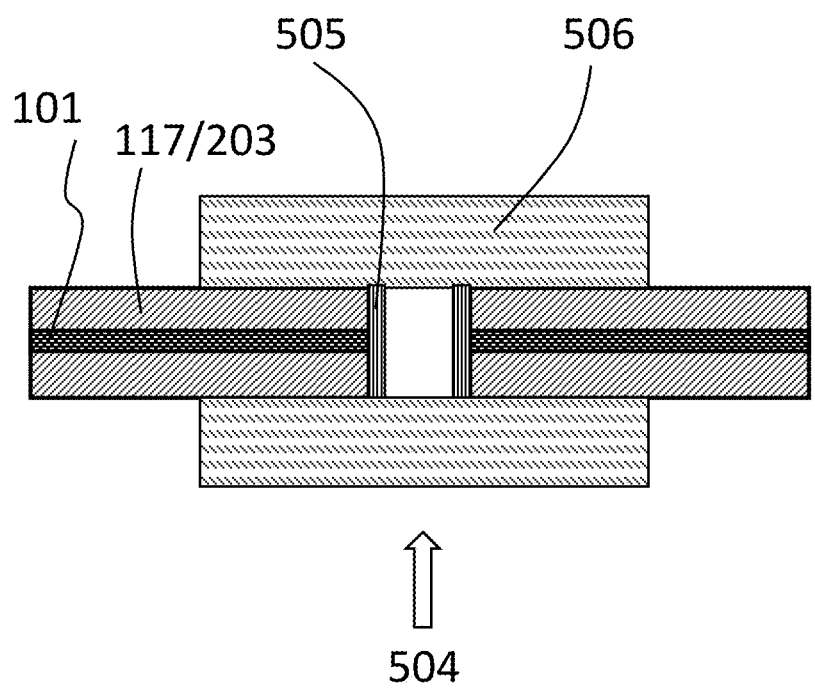
FIG. 17 shows a schematic drawing of a high performance fiber optic sensor based on a fiber Fabry-Perot cavity built with crystalline cladding and crystalline core optical fiber.

A modified fiber optic sensor may be fabricated according to FIG. 17 wherein the sensitivity and selectivity of the modified fiber sensor is enhanced by creating a Fabry-Perot resonant cavity 504 composed of crystalline cladding and crystalline fiber core, reflection coatings 505 on end surfaces of the crystalline fiber core and/or crystalline cladding, and holding sleeve 506. Sensitivity of temperature sensor is within 1% of sensing range or better. The sensitivity of pressure sensor will be better than $10^{-7}$/kPa. In terms of selectivity, the cross-talk from non-measurands is less than 50%. The shift of resonant wavelength of the Fabry-Perot resonant cavity 504 allows for determination of things such as temperature and pressure.

Figure 18:
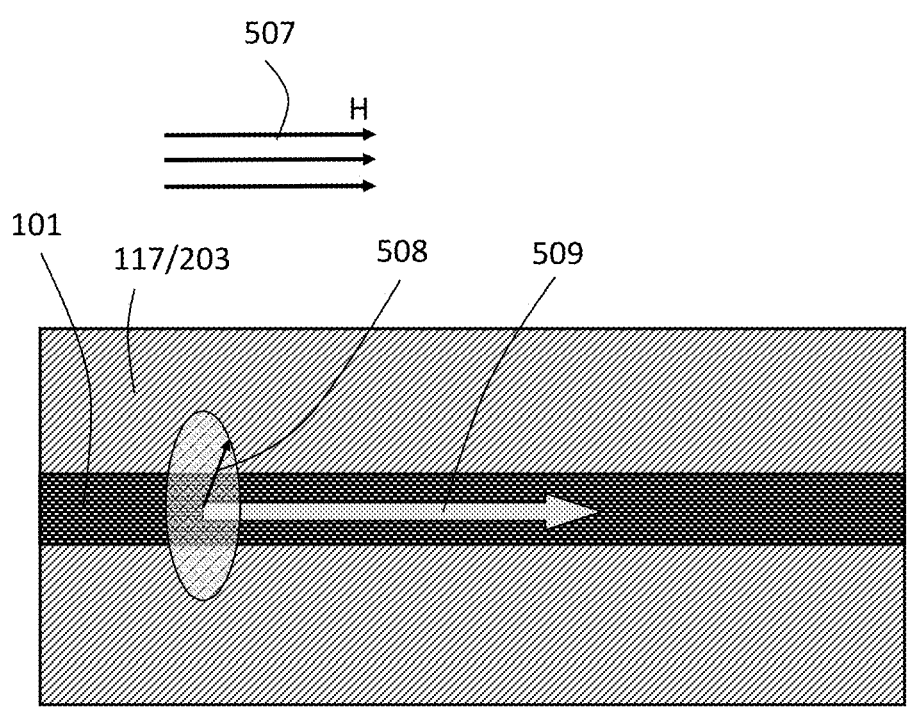
FIG. 18 shows a schematic drawing of a high sensitivity fiber optic magnetic field sensor based on magneto-optic crystalline cladding and crystalline core optical fiber.

A magnetic field sensor may also be fabricated according to FIG. 18 using a Bi-substituted yttrium iron garnet (YIG) crystalline fiber having a large Verdet magneto-optic constant (better than 1 deg/μm at a saturation magnetic field and at an operational wavelength of 633 nm) to realize a high sensitivity and high selectivity magnetic field sensor. The magnetic field sensitivity is better than 100 deg/Oe at an operational wavelength of 633 nm. Because fiber length is long (e.g., ≥10 cm), a small change in magnetic field 507 (e.g., 1 Oe) results in a large change in polarization direction 508 (e.g., >100 deg at an operational wavelength of 633 nm) of propagated light beam 509 within the fiber. Fiber optic sensors of the type disclosed herein, for example in FIG. 18, have applications in, for example, automatic navigation systems and smart electric grids.

Figure 19:
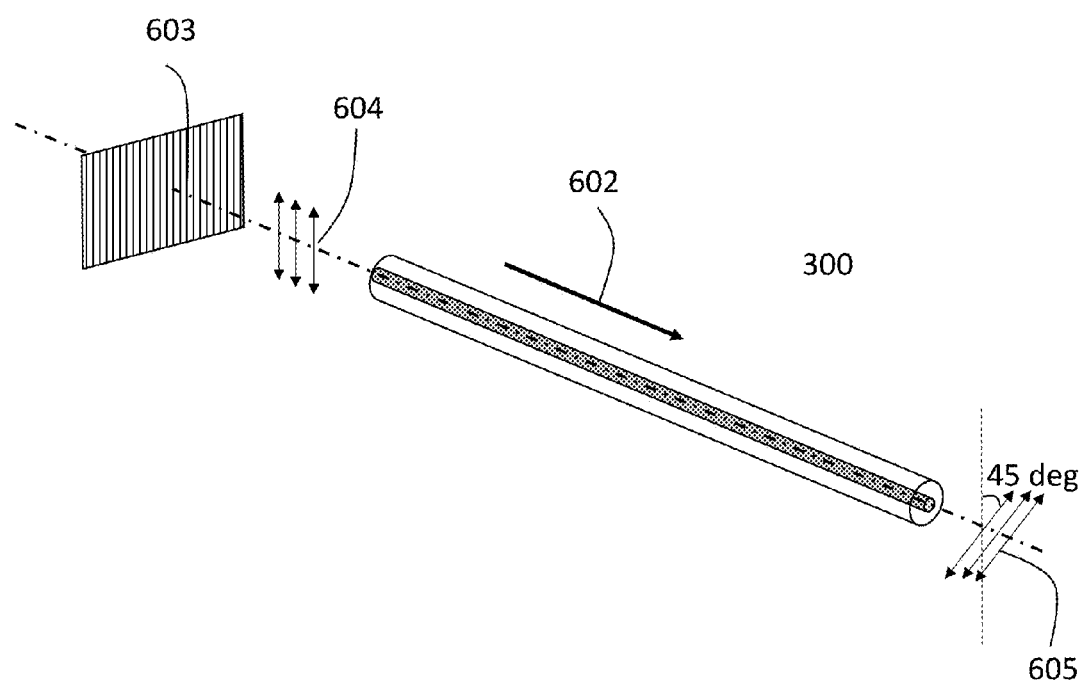
FIG. 19 shows a schematic drawing of an all-fiber optical isolator based on magneto-optic crystalline cladding and crystalline core optical fiber.

A compact (with a transversal dimension less than 4 mm×4 mm) all-fiber optic isolator may be fabricated according to FIG. 19 and comprises a magneto-optic crystalline cladding and crystalline core optical fiber 300, a magnetic field 602, and a polarizer 603, wherein the polarizer may be selected from the group consisting of an absorption-based polarizer; a birefringent-based polarizer; and a metallic nanogrid-based polarizer. The length and magnetic field are selected such that polarization of incoming light 604 is rotated by an angle 605 (for example, 45°) after passing through fiber 300. Since the back propagated light will be rotated by another 45°, it will be blocked by polarizer 603 such that an all-fiber optical isolator is realized. Because the crystalline cladding and crystalline core optical fiber is made from magneto-optic materials such as Bi- and/or Ce-substituted crystalline YIG, the all-fiber optic isolator has a large Verdet magneto-optic constant (better than 1 deg/µm at a saturation magnetic field and at an operational wavelength of 633 nm).

Alternatively, the crystalline cladding and crystalline core optical fiber may also be made from electro-optic materials such as potassium tantalate niobate (KTN), lithium niobate (LiNbO$_3$), and lithium tantalate (LiTaO$_3$) or piezoelectric materials such as barium titanate (BaTiO$_3$), lanthanum doped lead zirconate-titanate (PLZT), and lead magnesium niobate-lead titanate (PMN-PT), to form devices for sensing electric field, stress, and pressure.

Figure 20:
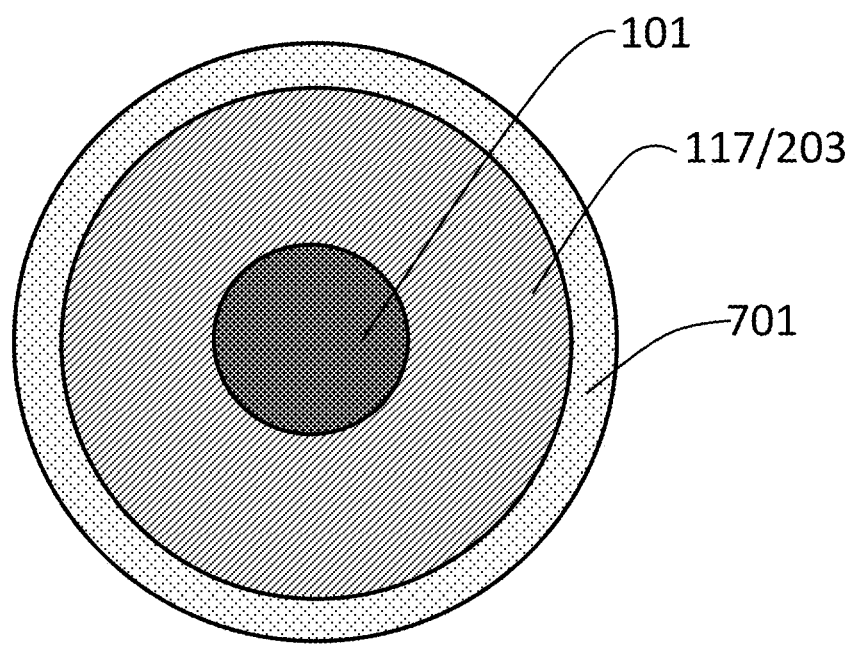
FIG. 20 shows an illustration of crystalline core and crystalline cladding optical fiber containing multiple cladding layers, including a crystalline core 101, an inner crystalline cladding 117/203 that has a refractive index lower than that of crystalline core, and an outer (crystalline or amorphous) cladding 701 that has a refractive index lower than that of crystalline inner cladding.
Figure 21:
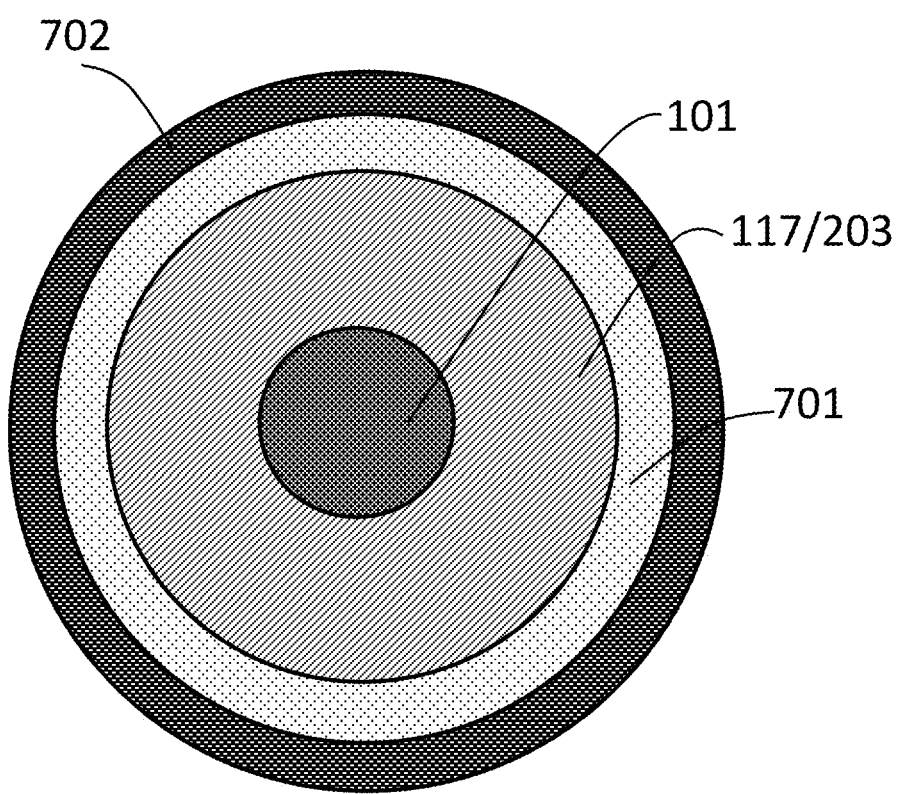
FIG. 21 shows an illustration of a metal overlay layer 702 on top of outer cladding layer 701.

In one embodiment, the devices disclosed herein by way of FIGS. 13-19 may comprise an outer cladding layer and an inner crystalline cladding layer, wherein the refractive index of the outer cladding layer is lower than the refractive index of the inner crystalline cladding layer. The outer cladding layer can be crystalline cladding formed by either LPE or HIP fabrication methods or amorphous cladding formed by dipping in a molten glass or by physical vapor deposition (including but not limited to vacuum evaporation, sputtering, pulsed laser deposition) or by chemical vapor deposition (including but not limited to chemical vapor deposition, metalorganic chemical vapor deposition, molecular beam epitaxy, atomic layer deposition) or by chemical and electrochemical methods (including but not limited to anodizing, plating), or by spraying or by roll-to-roll coating processing (including but not limited to hot melt coating, printing, lithography). FIG. 20 illustrates a crystalline cladding-crystalline core fiber optical system having a crystalline fiber core 101, an inner crystalline cladding layer 117/203 having a refractive index lower than the refractive index of the crystalline fiber core 101, and an outer crystalline and/or amorphous cladding layer 701 having a refractive index lower than the refractive index of the inner crystalline cladding layer 117/203. FIG. 21 illustrates an optional outer metal layer 702 overlaying the outer cladding layer 701, wherein the outer metal layer 702 is selected from the group consisting of including but not limited to silver, aluminum, copper, gold, platinum, titanium, chromium, nickel and combinations thereof.

IV. Advantages Over Other Methods

As reported below, embodiments as reported herein are typically superior to past attempts at making crystalline cladding and crystalline core optical fibers A. Glass Cladding and Crystalline Core Fibers Glass cladding and crystalline core optical fibers are known. These are fundamentally different from the crystalline cladding and crystalline core optical fibers, as reported herein.

At the earlier stage of glass cladding/crystalline core optical fiber, glass cladding was formed by directly pulling the crystalline fiber cores from melted glass (e.g., Byer et al, U.S. Pat. No. 5,077,087). More recently, parties reported a method of making glass cladding and crystalline core fiber by heating a composite preform comprising a crystalline core and a glass capillary tube (e.g., by a CO$_2$ laser illumination, Hsu, et al, US patent application 2014/0079363).

Unfortunately, although it is a relatively ease approach to clad the crystalline fiber core with a glass cladding, above approaches suffer from following fundamental limitations. First, the thermal conductivity of glass cladding is only around 1-2 W/m·K, which is much lower than that of crystalline fiber core (e.g., ~10 W/m·K for YAG fiber core). Thus, one of the major advantages of crystalline fiber—high thermal conductivity is largely compromised. Second, even with careful selection, the thermal expansion coefficient of glass cladding cannot perfectly match the thermal expansion coefficient of crystalline core, which can introduce mechanical stresses and cause the damage to the crystalline fiber core and/or glass cladding during the cooling, in particular, for the thin and long fiber cores. Finally, the relatively low softening/melting temperature of glass cladding (e.g., <1000° C.) makes the glass cladding/crystalline core fiber not suitable for high temperature (>1000° C.) fiber optic sensor application.

B. Modified Laser Heated Pedestal Growth (m-LHPG)

To form gradient index crystalline fibers, another previously attempted approach was to take advantage the movement of the rare earth ions within the melted crystalline preform by a modified LHPT method (e.g., Rusanov et al, U.S. Pat. No. 5,579,427), in which a thermal gradient was created with temperature peaking at the center of the molten zone. Although this approach may work for certain rare earth ion dopants (e.g., Nd), it does not work for other dopants (e.g., Er, Yb, Ho). For many dopants such as Er, Yb, Ho, the high mobility of liquid state uniformizes the dopant concentrations, which make it hard form a graded index and/or crystalline cladding and crystalline core optical fiber.

C. Other Coating Methods

There have been efforts to create cladding on crystalline core fiber by conventional coating methods such as sol-gel, evaporation, sputtering, and pulse laser deposition. However, it is very difficult to achieve low loss single crystalline cladding by these conventional coating methods. Furthermore, the coated films could have crack problem due to the mismatched thermal expansion coefficient and/or densification induced stress during the thermal annealing process. The problem could become severe when the coated films were thick.

D. Crystalline Films Attempted to be Grown by LPE

There have been failed efforts to grow crystalline films on thin and long crystalline fiber core by liquid phase epitaxy (LPE) and realize single or fewer mode operations. These previous efforts are entirely different from the LPE effort described in the present invention for multiple reasons. For example, none of the other LPE efforts teach the method of decreasing or precisely controlling the number of modes propagated in the crystalline cladding and crystalline core by (1) firstly reducing the crystalline fiber core diameter via an under-saturated LPE flux and then (2) growing the crystalline cladding layer on the thinned crystalline fiber core via a super-saturated LPE flux and the refractive index of grown crystalline cladding layer is different from the crystalline fiber core (e.g., lower than the refractive index of crystalline fiber core). Past attempts also failed to teach how to properly hold crystalline fiber without thermally induced stress during the LPE growing process. Their fibers, if prepared at all, would have been damaged by the thermally induced stress. Contrast that with methods reported herein, which retain the fiber without the thermally induced stress or reduced thermally induced stress such as by using pre-bent and/or one-end firmly holding method.

Older efforts also failed to teach how to use a mesh type bottom support to enhance the holding of the thin, long, fragile, and flexible crystalline fiber, as illustrated in FIG. 5G. It should be noticed that there is a relative movement between the crystalline fiber and the mesh type (1D or 2D) bottom support during the LPE growing process, which ensures a uniform cladding growth.

E. Specific Differences

For ease of reference, multiple prior efforts at methods are set forth below and distinguished. This recitation is not an admission that these are the best or the only ways to distinguish these technologies. No admission is meant or made with regard to these documents, including any implication of suitability for combination with each or other of relevance to one of skill in the art.

Kobayasi, U.S. Pat. No. 3,902,454, reports a method to hold a substrate wafer by a single curved clamping at one end of the crucible boat. Although this method can be used to hold conventional substrate wafer, it is not suitable to hold elongate crystalline fiber core because of the following reason. First, unlike the rigid substrate wafer, the thin and long crystalline fiber is fragile and flexible. It is hard to hold the fiber by simple clamp because the unclamped portion can still move due to the flexible nature of fiber. The clamp may also damage the fiber because the fiber is very fragile. Also, in conventional substrate wafer, one only needs to epitaxially grow thin film on one side of substrate wafer. However, in growing crystalline cladding on crystalline fiber core, cladding layer needs to enclose entire fiber core. Since at least a portion of side surface of fiber core needs to be in firm contact with the crucible boat if using this mounting method, the epitaxy layer cannot be grown in this area. Thus, this method is not suitable to hold elongate crystalline fiber core.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Solomon, U.S. Pat. No. 3,759,759, and Nelson Tilt Technique, RCA Review, p. 603, 1963, teach similar methods as Kobayasi, in which substrate wafer is mounted on the crucible by a single clamp or screw. Again, although this method can be used to hold conventional rigid substrate wafer, it is not suitable to hold elongate crystalline fiber core due to the following reason. First, unlike the rigid substrate wafer, the thin and long crystalline fiber is fragile and flexible. It is hard to hold the fiber by simple clamp because the unclamped portion can still move due to the flexible nature of fiber. The clamp may also damage the fiber because the fiber is very fragile. Also, in conventional substrate wafer, one only needs to epitaxially grow thin film on one side of substrate wafer. However, in growing crystalline cladding on crystalline fiber core, cladding layer needs to enclose entire fiber core. Since at least a portion of side surface of fiber core will be in a firm contact with the crucible boat if using this mounting method, the epitaxy layer cannot be grown in this area. Thus, this method is not suitable to hold elongate crystalline fiber core.

In contrast, in our proposed mounting method, the fiber surface of core will not be in contact with the crucible at all so that crystalline cladding can be grown to enclose entire fiber core. Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Koike et al., U.S. Pat. No. 4,354,453 reports a substrate holder having a substrate holding arm and a substrate holding screw for holding one end of a semiconductor substrate. Fujiyamn et al., U.S. Pat. No. 6,139,630 reports an apparatus for suspending polycrystalline rods at one end for processing by Czochralski method. Mizutani et al., U.S. Pat. No. 7,615,115 reports an apparatus having a substrate holder wherein vertically oriented substrates are oriented between grooves.

Although these methods may be used to hold conventional rigid wafer or thick rod, they are not suitable for holding thin and flexible fiber core for at least the following reasons. First, flexible fiber core cannot stay within the grooves vertically. Second, due to the need of relative movement between wafer and flux, fiber core can be easily broken by using these holding methods. Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Imaeda et al., U.S. Pat. No. 5,737,117, reports a usage of rectangular shape crucible in LPE processes, which has a shape matching that of an elongate planar crystal. Springthorpe, U.S. Pat. No. 3,809,010, reports a holder that has a shape convenient for the shape of substrate crystal to be processed. Fromage et al., U.S. Pat. No. 4,779,561, discloses a crucible for holding multiple substrates for LPE processes having a rectangular cavity for holding rectangular plate substrates. Buellesfeld, U.S. Patent Publication No. 2006/0236723 reports a crucible for forming core and cladding glass fibers having elongate tubular double crucible 1 and 2. Mahieu, et al, U.S. Pat. No. 4,393,806, reports a boat crucible for use in the epitaxial crystal growth. Pandelisev, U.S. Pat. No. 6,743,294, reports a boat-shaped crucible container for crystal growth.

Although these documents report different shapes of crucible for epitaxial growth of crystal or drawing glass fiber, none of these teach how to mount the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core.

Kitaoka et al., U.S. Pat. No. 7,435,295, reports epitaxial methods of crystal formation including the use of a rocking unit with different shift movements defined as "a linear repetitive motion, a pendulum motion, a rotational motion, or a combined motion of any of these movement modes. Shibata et al., U.S. Patent Publication No. 2009/0155580, reports moving a crucible from side-to-side by use of a reciprocating "swinging apparatus."

Although these documents report different movement modes for epitaxial growth of crystal, none of these teach how to mount the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core.

Bordui et al., U.S. Pat. No. 4,761,202, reports a method of growing optical crystals from a flux, including placing the seed crystal in under-saturated flux to clean the surface of seed crystal by melting out a layer of seed crystal. However, this document only reports use of under-saturated flux to clean the surface of seed crystal, it does not teach the method of reduce the number of modes propagated in a crystalline cladding and crystalline core optical fibers including the steps of reducing the diameter of a crystalline fiber core by applying an under-saturated LPE flux and then growing a crystalline cladding layer on the core with a lower refractive index by introduction of a super-saturated LPE flux. One of the major differences between our invention and this prior art is that the material compositions of under-saturated flux and super-saturated flux are the same except at different temperatures in this prior art. Thus, the refractive index of regrown crystal after the cleaning by the under-saturated flux can be same as the original seed crystal by employing this prior art method. Since the refractive index of the regrown crystal is same as the original seed crystal, the regrown crystal cannot be served as the cladding that requires a different refractive index.

In the present invention, the material composition of super-saturated flux is selected that can be different from the under-saturated flux, which ensures that the refractive index of grown crystal is different from the original crystalline fiber core so that a crystalline cladding can be achieved. Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Heinen, U.S. Pat. No. 4,818,722 reports a method of fabricating a strip shape waveguide by employing LPE. First, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. There is also a significant difference between the strip shape waveguide and our crystalline cladding and crystalline core optical fibers. First, the length of the strip waveguide is limited by the length of the substrate, which is less than 500 mm for most of crystalline material. On the other hand, the length of the crystalline cladding and crystalline core optical fiber as reported herein is only limited by the length of crystalline fiber core, which can be longer than 1,000 mm. Second, the strip waveguide is not able to be coiled because it is grown on the rigid substrate. On the other hand, crystalline cladding and crystalline core optical fiber is able to be coiled because cladding is grown on the flexible fiber core, which is a preferred nature for many applications such as fiber lasers and sensors. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Pan et al., U.S. Pat. No. 7,218,004, reports a method of changing the size of nanowire by controlling the saturation condition of the solute in solution. However, there are significant differences between our invention and this method. First, this document only teaches the method of changing the size of nanowire by controlling the saturation condition of the solute in solution for the purpose of fusing nanowire. In this prior art method, the newly grown crystal lattice can have the same material property as the original nanowire. For example, they have the same refractive index. Thus, they cannot form the cladding and core structure. It cannot be used as crystalline cladding and crystalline core optical fiber, which requires that the refractive index of cladding must be lower than that of core.

On the other hand, in our invention, there is a change in the material composition between the core and cladding of the fiber by selecting the composition of under-saturated flux that is used to reduce the crystalline core diameter and the super-saturated flux that is used to grow the crystalline cladding that has a different refractive index from the crystalline fiber core seed. For example, the core can be an Yb doped YAG and the newly grown cladding is pure YAG. In other words, the super-saturated flux only contains $Y_2O_3$ and $Al_2O_3$ but not $Yb_2O_3$ so that only pure YAG can be grown on the crystalline fiber core. Thus, the refractive index of newly grown cladding layer is lower than that of core because the refractive index of pure YAG is lower than that of Yb:YAG so that a cladding and core structure can be formed.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Matare, U.S. Pat. No. 4,012,242, reports a method for producing heteroepitaxial semiconductor by a harnessing melting back technique with unsaturated solution. However, there are significant differences between our invention and this method. In this prior art, the dissolved substrate during the melted back process is used to saturate the flux so that the composition of super-saturated flux is the same as the original substrate seed. Thus, the regrown crystalline has the same composition as the original substrate seed (including the same refractive index) so that one cannot achieve a core and cladding structure because it requires different refractive indices.

In the present invention, there is a change in the material composition between the core and cladding of the fiber by selecting the composition of under-saturated flux that is used to reduce the crystalline core diameter and the super-saturated flux that is used to grow the crystalline cladding that has a different refractive index from the crystalline fiber core seed. For example, the core can be an Yb doped YAG. If using this prior art method, $Y_2O_3$, $Al_2O_3$, and $Yb_2O_3$ are all dissolved in the flux. The regrown crystal is also an Yb:YAG crystal so that one cannot form a core and cladding structure that requires different refractive indices. On the other hand, in our present invention, material composition of under-saturated flux and super-saturated flux can be different. For instance, the super-saturated flux only contains $Y_2O_3$ and $Al_2O_3$ but not $Yb_2O_3$ so that only pure YAG can be grown on the crystalline fiber core. Thus, the refractive index of newly grown cladding layer is lower than that of core because the refractive index of pure YAG is lower than that of Yb:YAG so that a cladding and core structure can be formed.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Furthermore, Matare deals with the planar waveguide structure. There are significant difference between planar waveguide structure and our clad crystalline fiber, comprising of a near cylindrical shape crystalline fiber core and a crystalline cladding that has a slightly lower refractive index than that of core. First, the length of the planar waveguide is limited by the length of the substrate, which is less than 500 mm for most of crystalline materials. On the other hand, the length of the clad crystalline fiber is only limited by the length of crystalline fiber core, which can be longer than 1,000 mm. Second, the planar waveguide is not able to be coiled because it is grown on the rigid substrate. On the other hand, clad crystalline fiber is typically able to be coiled because cladding is grown on the flexible fiber core, which is a preferred nature for many applications such as fiber lasers and sensors.

Connolly et al, U.S. Pat. No. 4,642,143, reports a method of making a double heterostructure laser by harnessing the super-saturated solution for the epitaxy deposition and under-saturated solution for altering the shape via melt back. However, there are significant differences between our invention and this method. Since the melted back and growth processes happen in the same container in this prior art, it is very difficult to control the material composition difference between the under-saturated flux (used to melt back) and the super-saturated flux for growth due to the rapid movement of liquid flux and diffusion. Thus, the composition of super-saturated flux can be the same as the original substrate seed. Thus, the regrown crystalline has the same composition as the original substrate seed (including the same refractive index) so that one cannot achieve a core and cladding structure because it requires different refractive indices.

In the present invention, there is a change in the material composition between the core and cladding of the fiber by selecting the composition of under-saturated flux that is used to reduce the crystalline core diameter and the super-saturated flux that is used to grow the crystalline cladding that has a different refractive index from the crystalline fiber core seed. For example, the core can be an Yb doped YAG. If using this prior art method, $Y_2O_3$, $Al_2O_3$, and $Yb_2O_3$ are all dissolved in the flux. The regrown the crystal is also an Yb:YAG crystal so that one cannot form a core and cladding structure that requires different refractive indices. However, in our present invention, material composition of under-saturated flux and super-saturated flux can be different. For instance, the super-saturated flux only contains $Y_2O_3$ and $Al_2O_3$ but not $Yb_2O_3$ so that only pure YAG can be grown on the crystalline fiber core. Thus, the refractive index of newly grown cladding layer is lower than that of core because the refractive index of pure YAG is lower than that of Yb:YAG so that a cladding and core structure can be formed.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Furthermore, this prior art only teaches the method for making planar double heterostructure waveguide laser. There is a significant difference between the planar waveguide and our clad crystalline fiber, comprising of a near cylindrical shape crystalline fiber core and a crystalline cladding that has a slightly lower refractive index than that of core. First, the length of the planar waveguide is limited by the length of the substrate, which is less than 500 mm for most of crystalline materials. On the other hand, the length of the clad crystalline fiber is only limited by the length of crystalline fiber core, which can be longer than 1,000 mm. Second, the planar waveguide is not able to be coiled because it is grown on a rigid substrate. On the other hand, clad crystalline fiber is typically able to be coiled because cladding is grown on the flexible fiber core, which is a preferred nature for many applications such as fiber lasers and sensors. For example, the bending radius of a 100 micron crystalline cladding and crystalline core fiber can be as small as 5 cm.

Mattauch et al., U.S. Pat. No. 4,373,989, reports a method for in situ surface layer removal of a crystal substrate before LPE crystal growth using an under-saturated etch melt and a super-saturated growth melt for crystal growth. However, there are significant differences between our invention and this method. Since the melted back and growth processes happen in the same container only at different temperature in this prior art, it is very difficult to control the material composition difference between the under-saturated flux (used to melt back) and the super-saturated flux for growth due to the rapid movement of liquid flux and diffusion. Thus, the composition of super-saturated flux can be the same as the original substrate seed. Thus, the regrown crystalline has the same composition as the original substrate seed (including the same refractive index) so that one cannot achieve a core and cladding structure because it requires different refractive indices.

In the present invention, there is a change in the material composition between the core and cladding of the fiber by selecting the composition of under-saturated flux that is used to reduce the crystalline core diameter and the super-saturated flux that is used to grow the crystalline cladding that has a different refractive index from the crystalline fiber core seed. For example, the core can be an Yb doped YAG. If using this prior art method, $Y_2O_3$, $Al_2O_3$, and $Yb_2O_3$ are all dissolved in the flux. The regrown the crystal is also an Yb:YAG crystal so that one cannot form a core and cladding structure that requires different refractive indices. However, in our present invention, material composition of under-saturated flux and super-saturated flux can be different. For instance, the super-saturated flux only contains $Y_2O_3$ and $Al_2O_3$ but not $Yb_2O_3$ so that only pure YAG can be grown on the crystalline fiber core. Thus, the refractive index of newly grown cladding layer is lower than that of core because the refractive index of pure YAG is lower than that of Yb:YAG so that a cladding and core structure can be formed.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Furthermore, there is also a significant difference between the planar waveguide and our clad crystalline fiber, comprising of a near cylindrical shape crystalline fiber core and a crystalline cladding that has a slightly lower refractive index than that of core. First, the length of the planar waveguide is limited by the length of the substrate, which is less than 500 mm for most of crystalline materials. On the other hand, the length of the clad crystalline fiber is only limited by the length of crystalline fiber core, which can be longer than 1,000 mm. Second, the planar waveguide is not able to be coiled because it is grown on a rigid substrate. On the other hand, clad crystalline fiber is typically able to be coiled because cladding is grown on the flexible fiber core, which is a preferred nature for many applications such as fiber lasers and sensors. For example, the bending radius of a 100 micron crystalline cladding and crystalline core fiber can be as small as 5 cm.

Jones, et al., U.S. Pat. No. 3,967,987, reports a method of making heterojunction devices by utilizing an epitaxial deposition from a small size melt such that the substrate itself serves as a saturation source. However, there are significant differences between our invention and this method. Since the melted substrate serves as a saturation source in this prior art, the composition of super-saturated flux can be the same as the original substrate seed. Thus, the regrown crystalline has the same composition as the original substrate seed (including the same refractive index) so that one cannot achieve a core and cladding structure because it requires different refractive indices.

In the present invention, there is a change in the material composition between the core and cladding of the fiber by selecting the composition of under-saturated flux that is used to reduce the crystalline core diameter and the super-saturated flux that is used to grow the crystalline cladding that has a different refractive index from the crystalline fiber core seed. For example, the core can be an Yb doped YAG. If using this prior art method, $Y_2O_3$, $Al_2O_3$, and $Yb_2O_3$ are all dissolved in the flux. The regrown the crystal is also an Yb:YAG crystal so that one cannot form a core and cladding structure that requires different refractive indices. However, in our present invention, material composition of under-saturated flux and super-saturated flux can be different. For instance, the super-saturated flux only contains $Y_2O_3$ and $Al_2O_3$ but not $Yb_2O_3$ so that only pure YAG can be grown on the crystalline fiber core. Thus, the refractive index of newly grown cladding layer is lower than that of core because the refractive index of pure YAG is lower than that of Yb:YAG so that a cladding and core structure can be formed.

Furthermore, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Furthermore, there is a significant difference between the planar waveguide and our clad crystalline fiber, comprising of a cylindrical shape crystalline fiber core and a crystalline cladding that has a slightly lower refractive index than that of core. First, the length of the planar waveguide is limited by the length of the substrate, which is less than 500 mm for most of crystalline materials. On the other hand, the length of the clad crystalline fiber is only limited by the length of crystalline fiber core, which can be longer than 1,000 mm. Second, the planar waveguide is not able to be coiled because it is grown on a rigid substrate. On the other hand, clad crystalline fiber is able to be coiled because cladding is grown on the flexible fiber core, which is a preferred nature for many applications such as fiber lasers and sensors. For example, the bending radius of a 100 micron crystalline cladding and crystalline core fiber can be as small as 5 cm.

Nelson et al., U.S. Pat. No. 4,273,609, reports growth of garnet crystal through a LPE process including a rinse process to remove undesired primary residue. In this document, under-saturated flux is only used to remove undesired primary residue. It is not use to change the dimension of substrate.

In the present invention, under-saturated flux is used to reduce and precisely control the diameter of crystalline fiber core. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Finally, this document only teaches the method of making planar garnet crystal. There is a significant difference between the planar crystal and our crystalline cladding and crystalline core optical fiber, comprising of a cylindrical shape crystalline fiber core and a crystalline cladding that has a slightly lower refractive index than that of core. First, the length of garnet crystal is limited by the length of the substrate, which is less than 500 mm for most of crystalline materials. On the other hand, the length of the clad crystalline fiber is limited by the length of crystalline fiber core, which can be longer than 1,000 mm. Second, the planar crystal is not coilable because it is grown on the rigid substrate. On the other hand, clad crystalline fiber is coilable because cladding is grown on the flexible fiber core, which is a preferred nature for many applications such as fiber lasers and sensors. For example, the bending radius of a 100 micron crystalline cladding and crystalline core fiber can be as small as 5 cm.

Lee, U.S. Pat. No. 5,334,278, reports a method of growing epitaxial layer by having a special shape LPE boat to enable in-situ melt-etch. There are significant differences between our invention and this prior art. First, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Furthermore, this prior art fails to teach how to make the refractive index of grown crystalline layer after the in-situ etching lower than that of etched crystalline seed so that the grown crystalline layer after the in-situ etching can be served as a crystalline cladding. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Finally, there is a significant difference between the planar crystalline substrate and our clad crystalline fiber, comprising of a near cylindrical shape crystalline fiber core and a crystalline cladding that has a slightly lower refractive index than that of core. First, the length of the planar structure is limited by the length of the substrate, which is less than 500 mm for most of crystalline materials. On the other hand, the length of the clad crystalline fiber is limited by the length of crystalline fiber core, which can be longer than 1,000 mm. Second, the planar structure is not coilable because it is grown on the rigid substrate. On the other hand, clad crystalline fiber is coilable because cladding is grown on the flexible fiber core, which is a preferred nature for many applications such as fiber lasers and sensors. For example, the bending radius of a 100 micron crystalline cladding and crystalline core fiber can be as small as 5 cm.

Chin, U.S. Pat. No. 4,662,983, reports a method of using multiple melt back steps for removing gross contaminants and thermal degradation from InP-containing surfaces. There are significant differences between our invention and this prior art. In this prior art method, melting back is only used to remove contaminants. This prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Finally, there is a significant difference between the planar structure and our clad crystalline fiber, comprising of a near cylindrical shape crystalline fiber core and a crystalline cladding that has a slightly lower refractive index than that of core. First, the length of the planar structure is limited by the length of the substrate, which is less than 500 mm for most of crystalline materials. On the other hand, the length of the clad crystalline fiber is limited by the length of crystalline fiber core, which can be longer than 1,000 mm. Second, the planar structure is not coilable because it is grown on the rigid substrate. On the other hand, clad crystalline fiber is coilable because cladding is grown on the flexible fiber core, which is a preferred nature for many applications such as fiber lasers and sensors. For example, the bending radius of a 100 micron crystalline cladding and crystalline core fiber can be as small as 5 cm.

Yu, et al., U.S. Pat. No. 8,519,379, reports a method of making nanowire structured photodiode with a surrounding epitaxially grown layer. This is a significant difference between this prior art and our invention. The structure taught by this prior art can only be used to detect light but cannot be used to transmit the light due to the heavy absorption of PN junction.

In the present invention, the crystalline cladding and crystalline core fiber has no or minimum absorption that can be used to transmit the light—a fundamental function of optical fiber. In other words, the epitaxial growth of present invention is used to form a clad crystalline fiber, comprising of a near cylindrical shape crystalline fiber core and a crystalline cladding that has a slightly lower refractive index than that of core, which can be used to transmit the light over a relatively long distance (e.g., >10 cm).

Also, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core.

Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process. Furthermore, in this document, the PN-junction structure is grown on a planar structure. There is a significant difference between the planar structure and cylindrical core clad crystalline fiber. First, the length of the planar structure is limited by the length of the substrate, which is less than 500 mm for most of crystalline materials. On the other hand, the length of the clad crystalline fiber is limited by the length of crystalline fiber core, which can be longer than 1,000 mm. Second, the planar structure is not coilable because it is grown on the rigid substrate. On the other hand, clad crystalline fiber is coilable because cladding is grown on the flexible fiber core, which is a preferred nature for many applications such as fiber lasers and sensors. For example, the bending radius of a 100 micron crystalline cladding and crystalline core fiber can be as small as 5 cm.

Gunter et al., U.S. Pat. No. 8,846,969, reports a method of growing a specific type of electro-optic material—locked polyene bulk single crystal, single crystal thin film, and planar waveguide. There are significant difference between this method and our invention. First, this prior only teaches the method of making a particular type (i.e., locked polyene) crystal, crystal thin film, or planar waveguide. It does not teach anything related to making crystalline cladding and crystalline core optical fiber taught by the present invention, including precisely control the number of modes propagated in the fiber. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core.

Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process. Furthermore, there is a significant difference between the bulk crystal, or planar thin film, or planar waveguide taught in this method, and our clad crystalline fiber, comprising of a cylindrical shape crystalline fiber core and a crystalline cladding that has a slightly lower refractive index than that of core. For example, the dimension of the bulk crystal, or planar thin film, or planar waveguide is limited by the dimension of the substrate, which is less than 500 mm for most of crystalline materials. On the other hand, the length of the clad crystalline fiber is limited by the length of crystalline fiber core, which can be longer than 1,000 mm. Also, the bulk crystal, or thin film, or planar waveguide, is not coilable because it is grown on the rigid substrate. On the other hand, clad crystalline fiber is coilable because cladding is grown on the flexible fiber core, which is a preferred nature for many applications such as fiber lasers and sensors. For example, the bending radius of a 100 micron crystalline cladding and crystalline core fiber can be as small as 5 cm.

Flanigen et al., U.S. Pat. No. 3,341,302, reports a LPE method for growing emerald crystals. There are significant differences between this method and our invention. First, in this prior art, the grown crystal by LPE method has the same property (including the same refractive index) as the crystalline seed crystal. One cannot achieve a cladding and core structure that requires different refractive indices. However, in our present invention, the grown crystal has a different property from the crystalline seed. The refractive index of grown crystal is lower than that of the crystalline seed so that the core and cladding structure can be achieved, which enables the efficient light guiding effect.

Second, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core.

Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process. Furthermore, there is a significant difference between the bulk crystal and our clad crystalline fiber, the dimension of the bulk is limited by the dimension of the seed, which is less than 500 mm for most of crystalline material. On the other hand, the length of the clad crystalline fiber is limited by the length of crystalline fiber core, which can be longer than 1,000 mm. Also, the bulk crystal is not coilable. On the other hand, clad crystalline fiber is coilable because cladding is grown on the flexible fiber core, which is a preferred nature for many applications such as fiber lasers and sensors. For example, the bending radius of a 100 micron crystalline cladding and crystalline core fiber can be as small as 5 cm.

Gualtieri, U.S. Pat. Nos. 5,245,689, and 5,113,472, report a method of making planar aluminum garnet waveguide and fiber by epitaxial growth. However, there are significant difference between this and our invention. First, this prior art failed to teach how to precisely control the number of modes propagated in the crystalline cladding and crystalline core optical fiber during LPE process to enable single or few mode operation. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding) so that the diameter of the fiber core must be precisely controlled. For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

Morris, U.S. Pat. No. 5,572,725, reports a method of reinforce the strength of garnet fiber by adding an overlay garnet layer that having a lattice constant larger than that of the body garnet so as to provide a compressive strain to strengthen the fiber. However, there are significant difference between this prior art and our invention. First, in this prior art, the refractive index of overlay garnet layer (e.g., Yb:YAG, as taught by this prior art) can be higher than that of the body garnet (e.g., YAG, as taught by this prior art). Thus, the overlay garnet layer cannot be served as the cladding layer to guide the light transmission. On the other hand, in our invention, the refractive index of cladding layer is lower than that of core so that light can be guided in fiber core. Furthermore, the chemical and/or acid polishing treatment taught in this prior art is only used to polish and clean the surface. It is not used to precisely control the number of modes propagated in the optical fiber. To precisely control the number of modes propagated in the optical fiber, the fiber core diameter must be precisely controlled because there is a quantitative relationship between the number of propagated modes and the fiber parameters (including the core diameter as well as the refractive index difference between core and cladding). In other words, the amount of reduction in fiber optical diameter must be precisely controlled. To enable single or few mode operation, the diameter of crystalline fiber core needs to be thin (e.g., <50 microns) because there is a quantitative relationship between the number of propagated modes and the fiber parameters (including the core diameter as well as the refractive index difference between core and cladding). For example, Eq. (1) gives the condition for the single mode operation. Unfortunately, it is extremely difficult to directly grow a thin diameter (e.g., <50 microns) and long (e.g., >100 cm) crystalline fiber core using the existing crystalline fiber core growing techniques including LHPG method, micro-pulling method, and EFG method.

In the present invention, we clearly teach a method of precisely control and reduce the number of modes propagated in the crystalline cladding and crystalline core fiber by a unique LPE process. In the first step, under-saturated flux is used to reduce and precisely control the diameter of crystalline fiber core. Then, the super-saturated flux is used to grow the crystalline cladding layer atop of crystalline fiber core. The cladding layer has a lower refractive index than that of crystalline fiber core. Moreover, this prior art does not teach the method of mounting the crystalline fiber core in a form with no or reduced thermally induced stress (e.g., pre-bent form or firmly holding only one end and the other end is loosely held that can move in at least fiber axial direction, as illustrated in FIGS. 4 and 5A-5G) to prevent thermal stresses from damaging the fiber during the LPE growing process.

F. HIP

There have been efforts to fabricate optical fiber and/or waveguide involving hot isostatic pressing (HIP) process. However, those HIP related efforts are totally different from the HIP effort described in this current invention. For example, none of the older HIP related efforts involving high temperature (with a crystal melting temperature >1500° C.) crystalline cladding and crystalline core optical fibers. Some of them were related to glass cladding and glass core fiber or waveguides, which are totally different in terms of HIP condition. None of the older HIP related efforts involved the combination of HIP and solid state conversion so that polycrystalline cladding can be converted into single crystalline cladding, resulting in an increased transmission.

For the purpose of illustration, differences between our invention and some methods are described in the following. These differences are not necessarily exclusive.

Sanghera et al., U.S. Pat. No. 5,735,927, reports a method of forming a glass optical fiber preform using hot isostatic pressing techniques. This used hot isostatic pressing to press the glass core/tube composite at a tube glass softening temperature to collapse the tube onto the rod to create a preform including a core and a cladding layers. However, this only teaches the method of fabricating glass cladding and glass core fiber preform (or called clad glass preform), which is totally different from crystalline cladding and crystalline core fiber. In clad glass preform, at the elevated softening temperature both the core and cladding are softened. This is OK for the glass preform because both the glass core and the inner surface of glass tube can have a smooth surface.

In the HIP process of making crystalline cladding and crystalline core fiber (so called clad crystalline fiber), we must selected a proper HIP temperature that is higher than the softening temperature of polycrystalline tube but lower than the melting temperature of single crystalline core. In other words, in the HIP process of making crystalline cladding and crystalline core fiber, the single crystalline fiber core must maintain at the hard solid state in the present invention. Only the polycrystalline cladding is at the softening state. In this way, the smooth surface of single crystalline core can be maintained while the non-smooth polycrystalline tube inner surface was converted into smooth surface after HIP process. Such a smooth interface between core and cladding is the key to reduce the scattering induced transmission loss. Furthermore, the glass preform does not involve solid state conversion process of converting polycrystalline cladding into single crystalline cladding. Finally, the HIP temperature required for making clad crystalline fiber is much higher (e.g., >1500° C.) than that of making clad glass preform (e.g., <1500° C.).

Narita et al., U.S. Pat. No. 6,122,934, reports formation of an optical waveguide having a core formed on a substrates having a buffer layer and an upper clad layer. Waveguide is heated and uniformly pressurized by a hot isostatic pressing method to form a unitary structure. However, this only teaches the method of fabricating planar glass waveguide with HIP process. It does not teach the method of making crystalline cladding and crystalline core fiber. First, in our invention, the transparent polycrystalline microtube itself serves both as the potential cladding layer and the gas barrier. The extra protection film layer needed in this method is not required in our case. Second, the method is only suitable for making planar waveguide not the cylindrical shape optical fiber. The thin film coating process described in this method is only suitable for making planar thin film not the cylindrical shape fiber core and cladding. Third, the HIP temperature required for making clad crystalline fiber is much higher (e.g., >1500° C.) than that of making planar glass waveguide (e.g., <1500° C.). Finally, there is no solid state conversion process of converting polycrystalline cladding into single crystalline cladding to make planar glass waveguide.

Harrington et al., U.S. Pat. No. 4,532,000, reports a method of converting polycrystalline fibers into single crystalline fibers by creating a melt zone near one end of polycrystalline fiber. However, due to the need of creating a melt zone, this method cannot be used to fabricate crystalline cladding and crystalline core fiber. The high mobility of liquid state uniformizes the material composition, which make it hard form a graded index and/or crystalline cladding and crystalline core optical fiber, which requires a different material composition at different location.

Aggawal et al., U.S. Pat. No. 5,078,768, reports a method of forming low defect fluoride glass by HIP to eliminate bubbles in fluoride glass preform. However, this approach is not related to fabricate crystalline cladding and crystalline core optical fiber by HIP. For example, this document does not involve with (1) the single crystalline core, (2) the process of converting the polycrystalline microtube into polycrystalline cladding layer by HIP, (3) the process of converting the polycrystalline cladding into single crystalline cladding by high temperature solid state conversion. Furthermore, the required temperature for HIP fluoride glass preform (e.g., <1000° C.) is much lower than that of HIP polycrystalline microtube (e.g., >1500° C.).

Scott et al., U.S. Pat. Nos. 5,549,746 and 5,451,553, report a method of solid state thermal conversion of polycrystalline alumina to single crystalline sapphire. However, this does not teach how to apply solid state conversion to crystalline cladding and crystalline core optical fiber. The single crystal (e.g., sapphire) made by this prior art method has a same and uniform refractive index distribution, which cannot form crystalline cladding and crystalline fiber. However, in our invention, although both core and cladding are at single crystalline state after solid state conversion, core and cladding have different refractive indices because different compositions of core and cladding can be maintained at the original location during HIP and solid state conversion processes so that a clad crystalline fiber can be realized.

Lighty, U.S. Pat. No. 4,428,646, reports a method of forming an optical fiber by heating a combination of two salts having different melting points and refractive indices. In this prior art method, in order to have the mechanical strength to hold the fiber, the melting temperature of cladding layer that has a lower refractive index or the softening temperature of outer glass tube needs to be higher than that of crystalline fiber core, which makes the fabrication method only suitable for certain salt materials such as KCl/KBr. It cannot be used to make high temperature crystalline cladding and crystalline core fiber (such as YAG or sapphire) because the melting temperature of high temperature crystalline material (e.g., YAG or sapphire) is higher than the softening temperature of glass tube. Furthermore, the melting temperature of single crystalline core is higher than the softening temperature of polycrystalline cladding.

In the present invention, we take advantage of the fact that the softening temperature of polycrystalline cladding is lower than the melting temperature of single crystalline core. The HIP temperature is lower than the melting temperature of single crystalline core but higher than the softening temperature of polycrystalline cladding. Thus, the single crystalline core maintains the solid state so as to provide the mechanical strength to hold the shape of the fiber during the HIP process, which is totally different from this prior art. In this prior art, the crystalline powder of core portion is melted to form crystalline core. Furthermore, this prior art failed to teach how to improve the transmittance of cladding layer by applying solid state conversion to convert polycrystalline cladding to single crystalline cladding.

Jiang et al, U.S. Pat. No. 6,598,429, reports formation of an optical glass fiber preform from a core glass rod and glass tube cladding. However, this is only suitable for making the gradient index glass preform. It cannot be used to make clad crystalline fiber. It does not involve HIP process. It simply bonds the glass core and glass cladding together via thermal diffusion. However, in our invention, HIP process is used to convert polycrystalline microtube into polycrystalline cladding. Furthermore, in our invention, polycrystalline cladding can be further converted into single crystalline cladding via solid state conversion so that the transmittance of crystalline cladding layer can be further increased.

Horne et al, U.S. Pat. No. 7,905,114, reports a method for manufacturing optical glass fiber preform by involving particle coating with a diameter less than 500 nm. However, this method is only suitable for making glass preform. It cannot be used to make clad crystalline fiber. The uniform crystalline cladding layer cannot be formed when involving particle coating.

Oku et al., U.S. Pat. No. 5,352,259, reports a method of making a porous silica-based glass preform by applying pressure on a mold. However, this method is only suitable for making porous glass preform. It does not suitable for making clad crystalline fiber due to the following reason. Unlike the glass fiber, porous preform cannot be converted to transparent clad crystalline fiber via dehydration and sintering for crystalline cladding and crystalline core fiber.

C. Petrido et al., U.S. Pat. No. 8,132,429, reports a method for fabricating an optical fiber preform by supplying a silica grain into the interior space. However, this method is only suitable for making glass fiber. It does not suitable for making clad crystalline fiber due to the following reason. Unlike glass fiber, the silica grain cannot be converted to transparent clad crystalline fiber via sintering.

Ohga et al., U.S. Pat. No. 7,486,862 reports a method of making optical fiber by drawing a core rod with a cladding pipe together. However, this can only be used to make glass fiber. It cannot be used to make clad crystalline fiber. Since there is no softening point for the crystalline fiber core, clad crystalline fiber cannot be drawn by using this method.

Po, U.S. Pat. No. 7,215,858, reports a design of ring core glass fiber. However, this is not related to clad crystalline fiber. It does not teach anything related to make crystalline cladding by HIP method and convert the polycrystalline cladding to single crystalline cladding via solid state conversion.

Snowdon et al., U.S. Pat. No. 6,837,075, reports a method of bonding optical fiber with a metallic element together by using glass fixative. However, this is not related to clad crystalline fiber. It does not teach anything related to make crystalline cladding by HIP method and convert the polycrystalline cladding to single crystalline cladding via solid state conversion.

Fleming et al., U.S. Pat. No. 6,446,468, reports a method of fabricating optical fiber involving overcladding. This method is only suitable for making glass fiber. However, this does not teach how to make clad crystalline fiber. It does not teach anything related to make crystalline cladding by HIP method and convert the polycrystalline cladding to single crystalline cladding via solid state conversion.

Kramer et al., U.S. Pat. No. 5,664,040, reports a method of fiber assembly involving a sealing medium. However, this is not related to clad crystalline fiber. It does not teach anything related to make crystalline cladding by HIP method and convert the polycrystalline cladding to single crystalline cladding via solid state conversion.

Hihara et al., U.S. Pat. No. 5,244,485, reports a method of making silica glass preform by compressing the mold charged with a forming material containing silica powder to form a porous preform. The porous preform is further converted into transparent glass preform by sintering at high temperature. This method is only suitable for making clad glass fiber. However, this is not related to clad crystalline fiber. It does not teach anything related to make crystalline cladding by HIP method and convert the polycrystalline cladding to single crystalline cladding via solid state conversion.

Zerfas et al., U.S. Patent Application No. 2009/0180745, reports a method of making launch connector of an ureteroscope, comprising a fused optical fiber. This is related to glass fiber devices. However, this is not related to clad crystalline fiber. It does not teach anything related to make crystalline cladding by HIP method and convert the polycrystalline cladding to single crystalline cladding via solid state conversion.

Buchanan et al., U.S. Patent Application No. US2003/0164006, reports a method of bonding optical fiber preforms to drawing of the optical fiber. This is related to making glass fiber. However, this is not related to clad crystalline fiber. It does not teach anything related to make crystalline cladding by HIP method and convert the polycrystalline cladding to single crystalline cladding via solid state conversion.

Mansfield et al., U.S. Pat. No. 4,826,288, reports a method of fabricating optical fibers having cores with high rare earth content by utilizing rare earth chelate vapor. However, this is not related to clad crystalline fiber. It does not teach anything related to make crystalline cladding by HIP method and convert the polycrystalline cladding to single crystalline cladding via solid state conversion.

H. Kim, et al., "Processing and characterization of polycrystalline YAG (Yttrium Aluminum Garnet) core-clad fibers," SPIE 9081, p. 908103-1, 2014, reports fabricating a polycrystalline cladding on a polycrystalline fiber core by sintering a preform consisting of a ceramic paste core and a ceramic paste cladding. However, the irregular non-smooth boundary between the polycrystalline core and polycrystalline cladding makes the fiber have a large scattering loss, which is detrimental to the performance of crystalline fiber.

T. Fukuda, et al, US Patent Application U.S. 2008/0008438 A1, reports a method of making self-coated single crystals by taking advantage of temperature gradient along the radial direction during the micro pulling process and the slight difference in melting temperature between the crystal core and coating. However, this method is only suitable for fabricating relatively large diameter crystalline rod (e.g., >1 mm). It is very difficult to fabricate the preferred fewer or single mode crystalline fiber because it is extremely difficult to control the temperature gradient distribution when the fiber diameter is thin (e.g., <150 microns). Furthermore, although this approach may work for certain rare earth ion dopants (e.g., Nd), it does not work for other dopants (e.g., Er, Ho). For many dopants such as Er, Ho, the high mobility of liquid state quickly uniformizes the dopant concentrations during the fiber drawing process, which make it hard form a non-uniform doping distribution, in particular for the thin core (e.g., <150 micron diameter) crystalline cladding and crystalline core fiber. Finally, this prior art does not teach anything related to make crystalline cladding by HIP method and convert the polycrystalline cladding to single crystalline cladding via solid state conversion.

Having described in the invention in detail, those skilled in the art will appreciate that, given the disclosure herein, modification may be made to the invention without departing from the spirit of the invention concept. It is not intended that the scope of the invention be limited to the specific and preferred embodiments illustrated and described. All documents referenced herein are hereby incorporated by reference, with the understanding that where there is any discrepancy between this specification and the incorporated document, this specification controls.

We claim:

1. A method for preparing a crystalline clad and crystalline core optical fiber, comprising:
   securing a crystalline fiber core having a refractive index and a first end and a second end in a holder with no or minimized thermally induced stress, wherein the first end of the crystalline fiber core is secured in the holder and wherein the second end is free to move in at least an axial direction of the fiber within the holder;
   immersing the crystalline fiber core into at least one molten liquid phase epitaxy (LPE) solution comprising at least one flux material and at least one cladding material until a crystalline cladding layer has formed thereon, said crystalline cladding layer having a lower refractive index than the crystalline fiber core refractive index.

2. The method of claim 1, further comprising, prior to the step of immersing the crystalline fiber core, reducing thermally induced stress on the crystalline fiber core by bending the crystalline fiber core in at least one location on the crystalline fiber core.

3. The method of claim 1, further comprising the molten LPE solution through a 1-dimensional or 2-dimensional mesh bottom support, wherein the molten flux passes through the mesh bottom support and there is a relative movement between the fiber core preform and mesh bottom support along at least the axial direction of the fiber during an LPE growing process, resulting in a uniform cladding growth.

4. The method of claim 1, further comprising controlling the number of modes propagated in the crystalline cladding and crystalline core optical fiber is controlled steps comprising:
   immersing the crystalline fiber core in an under-saturated LPE solution with said at least one flux material to reduce a diameter of the crystalline fiber core until reaching a desired value that matches a desired number of propagated modes, and
   immersing the crystalline fiber core in a super-saturated LPE solution with said at least one flux material and at least one cladding material until a crystalline cladding layer that has a lower refractive index than that of fiber core has formed on the crystalline fiber core.

5. The method of claim 1, wherein the holder is enclosed in a crucible, wherein said crucible includes a cavity and wherein the cavity contains the at least one LPE solution.

6. The method of claim 5, wherein the crucible has a shape that matches the shape of crystalline cladding and crystalline core fiber.

7. The method of claim 5, wherein at least one of the holder and the crucible has a movement pattern selected from the group consisting of (a) linearly back and forth along the axial direction of fiber core; (b) rotationally back and forth within an angle of +/−90° with respect to the axial direction of fiber, (c) linearly back and forth in a direction perpendicular to the axial direction of fiber; and (d) or the combinations of above.

8. The method of claim 5, wherein the crucible used to contain the LPE flux solution is made from a material selected from the group consisting of platinum (Pt), platinum-gold (Pt—Au) alloys, platinum-rhodium (Pt—Rh) alloys, iridium (Ir), platinum-iridium (Pt—Ir) alloys, dispersion-hardened platinum, and dispersion-hardened platinum alloys.

9. The method of claim 5, wherein the holder used to hold the fiber is made from a material selected from the group consisting of platinum (Pt), platinum-gold (Pt—Au) alloys, platinum-rhodium (Pt—Rh) alloys, iridium (Ir), platinum-iridium (Pt—Ir) alloys, dispersion-hardened platinum, and dispersion-hardened platinum alloys.

10. The method of claim 1, wherein said at least one flux material is selected from the group consisting of a lead oxide-boron trioxide mixture (PbO—B2O3), a barium oxide-boric oxide-barium fluoride mixture (BaO—B2O3-BaF2), a molybdenum oxide-lithium molybdate mixture (MoO3-Li2MoO4), a lead oxide-boron trioxide-lead fluoride mixture (PbO—PbF2-B2O3), a lead oxide-vanadium pentoxide mixture (PbO—V2O5), a molybdenum oxide-potassium fluoride mixture (KF—MoO3), a potassium fluoride-barium titanate mixture (KF—BaTiO3), a aqueous potassium carbonate (K2CO3), a lead oxide-lead fluoride mixture (PbO—PbF2), a lead fluoride-boron trioxide mixture (PbF2-B2O3), a lithium oxide-molybdenum oxide mixture (Li2O—MoO3), a lead oxide-bismuth oxide mixture (PbO—Bi2O3), a molybdenum oxide-potassium molybdate-yttria mixture (MoO3-K2MoO4-Y2O3 and mixtures thereof.

11. The method of claim 1, wherein the crystalline core and/or crystalline cladding is selected from the group having a garnet composition of R3 (Al,T)5O12 wherein R represents one or more of the elements selected from the group consisting of calcium, magnesium, sodium, strontium, yttrium, lanthanum, praseodymium neodymium, samarium, europium, gadolinium, terbium, dysprosium, holmium, erbium, thulium, ytterbium and lutetium; and T represents one or more of the 3-valent elements selected from the group consisting of gallium, indium, and scandium.

12. The method of claim 1, wherein the core and/or cladding material is selected from the group consisting of pure and/or doped yttrium lithium fluoride (YLF), pure and/or doped yttrium orthovanadate (YVO4), pure and/or doped gadolinium orthovanadate (GdVO4), pure and/or doped colquiriite (LiSaF), pure and/or doped alumina (Al2O3), pure and/or doped spinel (MgAl2O4), pure and/or doped aluminum oxynitride (AlON), pure and/or doped yttria (Y2O3), pure and/or doped zirconia (ZrO2), pure and/or doped aluminum nitride (AlN), pure and doped yttrium iron garnet (YIG), pure and/or doped potassium tantalate niobate (KTN), pure and/or doped lithium niobate (LiNbO3), pure and/or doped tantalate niobate (LiTaO3), pure and/or doped lanthanum lead zirconate-titanate (PLZT), and pure and/or doped lead magnesium niobate lead titanate (PMN-PT).

13. The method of claim 12, wherein the cladding material is a doped cladding material comprising a dopant, and wherein the dopant is selected from the group consisting of erbium, ytterbium, neodymium, thulium, holmium, chromium, cerium, samarium, dysprosium, terbium, titanium, vanadium, magnesium, manganese, iron, cobalt, nickel, copper, bismuth, and combinations thereof.

14. The method of claim 1, further comprising preparing a crystalline fiber core though a method selected from the group consisting of laser heated pedestal growth (LHPG), micro-pulling, and edge-defined film-fed growth (EFG).

15. The method of claim 1, further comprising, prior to or concurrently with immersing the crystalline fiber core preform into the under-saturated LPE flux, reducing the diameter of the crystalline fiber core.

\* \* \* \* \*